United States Patent [19]

Cordill

[11] 4,233,500
[45] Nov. 11, 1980

[54] METHOD AND APPARATUS FOR PROVIDING A DIGITAL OUTPUT IN RESPONSE TO AN ANALOG INPUT AND FOR PROVIDING AN ANALOG OUTPUT IN RESPONSE TO A DIGITAL INPUT

[75] Inventor: Leroy D. Cordill, Bartlesville, Okla.

[73] Assignee: Phillips Petroleum Company, Bartlesville, Okla.

[21] Appl. No.: 840,425

[22] Filed: Oct. 7, 1977

[51] Int. Cl.$^2$ .................. G06F 3/05; G06F 15/46; H03K 13/09
[52] U.S. Cl. .................... 235/310; 364/200; 340/347 AD; 340/347 DA
[58] Field of Search ............. 340/347 AD, 347 DA, 340/347 M; 364/200

[56] References Cited

U.S. PATENT DOCUMENTS

| | | | |
|---|---|---|---|
| 3,264,574 | 8/1966 | Loofbourrow | 340/347 AD |
| 3,588,530 | 6/1971 | Langan | 340/347 AD |
| 3,623,077 | 11/1971 | Clark | 340/347 DA |
| 3,651,517 | 3/1972 | Kurek | 340/347 DA |
| 3,742,489 | 6/1973 | Lefevre et al. | 340/347 AD |
| 3,882,488 | 5/1975 | Kosakowski et al. | 340/347 AD |
| 3,990,073 | 11/1976 | Duttweiler | 340/347 AD |
| 3,997,894 | 12/1976 | Levine | 340/347 AD |
| 3,999,129 | 12/1976 | Kasson | 340/347 AD |
| 4,016,557 | 4/1977 | Zitelli et al. | 340/347 AD |

*Primary Examiner*—Malcolm A. Morrison

[57] ABSTRACT

The accuracy of the conversion of an analog signal to digital form is improved by amplifying the input signal by different factors and automatically utilizing the highest amplified input signal which has a voltage level within operational limitations in the analog to digital conversion process. Output data from a digital computer, based on the input data, is converted from digital form to analog form and is routed to a required location by the use of control logic and optically isolated digital signals used to address other computers.

47 Claims, 10 Drawing Figures

METHOD AND APPARATUS FOR PROVIDING A DIGITAL OUTPUT IN RESPONSE TO AN ANALOG INPUT AND FOR PROVIDING AN ANALOG OUTPUT IN RESPONSE TO A DIGITAL INPUT

This invention relates to conversion of an analog signal to a digital signal and to conversion of a digital signal to an analog signal. In one aspect this invention relates to a method and apparatus for optimizing the accuracy of the analog-to-digital conversion of low-level data signals. In another aspect this invention relates to a method and apparatus for providing an optically isolated digital output signal from a digital computer and for automatically selecting one of a number of digital-to-analog converters to be used to convert a digital output signal from a digital computer to an analog signal.

Analog to digital converters and digital to analog converters are well known in the art. Use of such converters has grown rapidly as the use of digital computers has expanded. With this expanded use has come a need for better means of interfacing an analog to digital converter with some process signals to provide more accurate analog to digital conversions and thus provide more accurate data to the digital computers.

Output data signals from the digital computer, based on the input data from the process, are used for a number of applications. As these applications have grown, the need for digital-to-analog conversion systems which can not only convert a digital signal to analog form but can also route the output signal to the proper channel has also grown. Because of the many times that the output signal from one computer is transmitted to another computer, improved methods of transmitting such data to another computer are needed.

The present invention represents an improvement over the prior art in that it provides improved accuracy of the analog-to-digital conversion through the use of amplification of the analog data signal to produce at least one additional analog data signal of greater magnitude, and automatic selection of the strongest usable data signal. In a presently preferred embodiment, an additional improvement is provided by automatic voltage offset compensation of the analog data signal to provide a stronger data signal to the analog-to-digital converter. Another embodiment of the invention provides improved routing and conversion of a digital ouptut signal from a digital computer.

The present invention is particularly advantageous in the monitoring and control of complex system which generally involves the acquisition of low-level signals from a variety of sources. In many modern control applications digital computers are utilized to process these low-level data signals. Since the low-level data signals will usually be in analog form they must be accurately converted to digital form for processing by the digital computer.

Control or data signals from a digital computer are used to drive printers, control some process, or provide information to other computers. For many of these applications, the control or data signals from a digital computer must be converted to analog form. Since the control or data signals from a digital computer may be utilized in a number of other applications, it is necessary that a method of digital-to-analog conversion be utilized which can not only perform the digital-to-analog conversion but can also route the computer output data over the proper channels.

Accordingly, it is an object of this invention to provide a method and apparatus for the conversion of an analog signal to a digital signal and for conversion of a digital signal to an analog signal. Another object of this invention is to provide a method and apparatus for enhancing the accuracy of the analog-to-digital conversion of low-level data signals. Yet another object of this invention is to provide a method and apparatus for providing an optically isolated digital output signal from a digital computer and for automatically selecting one of a number of digital-to-analog converters to be used to convert a digital output signal from a digital computer to analog form.

In accordance with the present invention, a method and apparatus is provided for enhancing the accuracy of an analog to digital conversion of a low-level data signal by amplifying the data signals by one or more factors of differing magnitude and then automatically supplying the largest data signal, which is within operational limits, to an analog-to-digital converter.

A method and apparatus is also provided whereby an analog data signal voltage may be slightly reduced so that one of the corresponding amplified data signals will be reduced to a voltage level that is within operational limits.

A method and apparatus is also provided whereby the digital output signals from a digital computer are routed by a logic sequence to the proper channel for conversion to an analog signal to be used in some specified application. Optically isolated digital signals are used to inform another computer that data is available on the channel selected for use in the digital-to-analog conversion.

Additional objects and advantages of the invention will be apparent from the following description of a preferred embodiment of the invention as illustrated by the drawings in which.

For the sake of simplicity, the invention is illustrated and described in terms of a specific application in which a low-level analog data signal from a chromatographic analyzer is converted to digital form for processing by a digital computer. Digital data from the computer, based on the analog data signal from a chromatographic analyzer, is then converted to analog form to be used in controlling some process, driving a printer, or providing information to another computer. Although the invention is illustrated and described in terms of a specific application, the applicability of the invention extends to other applications where conversion of low-level analog signals to digital form for processing by a digital computer or conversion of the digital data output by the computer back to analog form is desired.

Figure 1A:
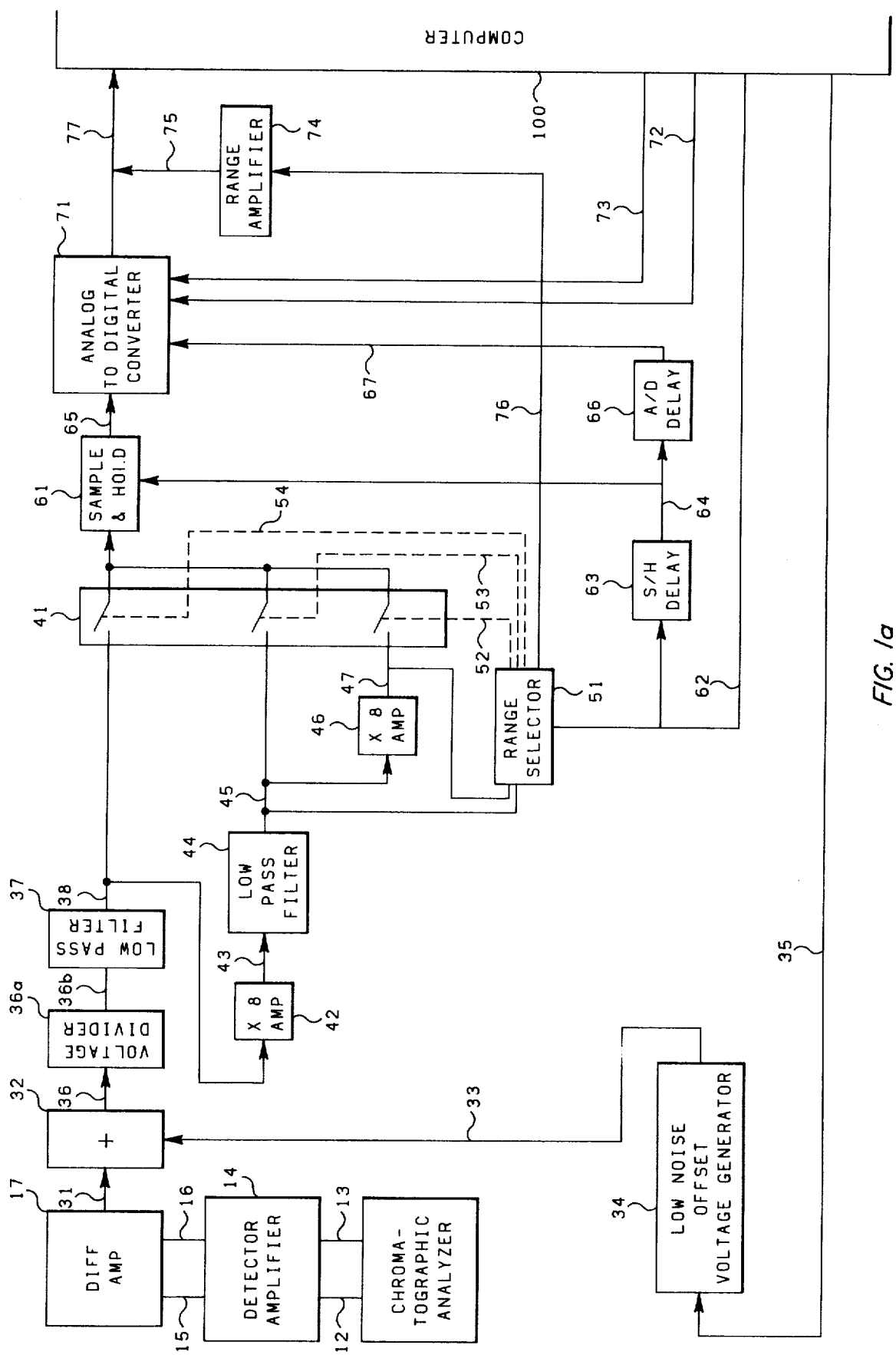
FIG. 1A is a block diagram of a computer system utilizing an analog-to-digital conversion system.

Referring now to the drawings and in particular to FIG. 1A, the analog output signals 12 and 13 of chromatographic analyzer 11 are buffered by amplifier 14 and provided as input signals 15 and 16 to differential amplifier 17. Analog signals 15 and 16, provided to the differential amplifier 17, are preferably positive voltages and in the illustrated embodiment should not be more negative than −0.6 volts. The actual voltage of analog signals 15 and 16 should not exceed +10.24 volts for the illustrated embodiment. In a preferred embodiment, the more positive analog voltage from amplifier 14 is analog signal 15.

Analog signals 15 and 16 are supplied as inputs to the differential amplifier 17. Differential amplifier 17 outputs a signal 31 proportional to the difference between the two input signals 15 and 16. Also, as is well known in the art, differential amplifier 17 rejects any voltages that are common to both input terminals; thus acting as a partial filter of unwanted interference.

Signal 31 is supplied to summing means 32. Summing means 32 is also supplied with signal 33 representative of a signal having a voltage level which may range from −0.625 volts to +0.605 volts provided by low noise offset voltage generator 34. The value of signal 33 is determined by balance command signal 35 from computer means 100.

Signal 33 is added to signal 31 by adding means 32. The resulting signal 36 is then passed through voltage divider means 36a. Voltage divider 36a reduces the peak voltage from a maximum of +10.24 volts for signal 36 to a maximum of 6.4 volts for signal 36b. The resulting signal 36b is passed through low-pass filter means 37 which rejects noise and unwanted interference. Output signal 38 from low-pass filter means 37 is then provided as one input to switching means 41. In a presently preferred embodiment the low-pass filter means 37 is a two-pole filter with a pass band of 16 Hz which provides rejection of noise and 20 db rejection of 50/60 Hz interference.

Signal 38 is amplified by a first suitable factor, e.g. eight, by amplifier means 42. The resulting signal 43 is passed through low-pass filter means 44 which provides further rejection of noise and unwanted interference. Output signal 45 from low-pass filter means 44 is provided as a second input to switching means 41.

Signal 45 is amplified by a second suitable factor, e.g. eight, by amplifier means 46. The resulting signal 47 is provided as a third input to switching means 41. Thus signals 45 and 47 are amplified analog signals having differing amplification factors with respect to analog signal 38. Signals 45 and 47 are also supplied to range selector 51. Range selector 51 looks first to signal 47 to determine if the voltage level of signal 47 exceeds the maximum desirable input voltage, e.g. 6.4 V. If the voltage level of signal 47 does not exceed the maximum desirable input voltage level, then signal 47 is selected to be supplied to sample and hold means 61 and no further comparisons for other signals, e.g. signals 45 and 38, are made. If the voltage level of signal 47 does exceed the maximum desirable input voltage level, then signal 45 is tested to see if it exceeds the maximum desirable input voltage level, i.e. 6.4 volts. If signal 45 does not exceed the maximum desirable input voltage level then signal 45 is selected to be the input to sample-and-hold means 61. If signal 45 does exceed the maximum desirable input voltage level then signal 38 is selected to be input to sample-and-hold means 61. This allows automatic selection of the most sensitive usable range.

In the described example, if signal 38 is less than 0.10 V, then signal 47 will be selected because (64) (0.10 V)=6.4 V. If signal 38 is greater than 0.10 V but less than 0.8 V, then signal 45 will be selected because (8) (0.8 V)=6.4 V. If signal 38 is greater than 0.8 V then signal 38 is selected.

As many amplifiers can be employed as desired to provide the desired number of ranges for selection, such amplifiers with the same or differing amplification factors can be connected in series, as shown, or amplifiers with differing amplification factors can be connected in separate parallel channels.

It should be noted that the primary use of low noise offset voltage signal 33 is to reduce the voltage level of signal 31 to enable signal 47 or signal 45 to be utilized in the analog-to-digital (A/D) conversion. For example, assume that signal 31 has a voltage level of 1.60 V. If the low noise offset voltage signal 33 were not utilized, then signal 38 would have a voltage level of 1.0 V because of the attenuation by device 32, signal 45 would have a voltage level of 8 V, and signal 47 would have a voltage level of 64 volts. Signal 38 would be selected by range selector 51 to be provided to sample-and-hold means 61. However, if a low noise offset voltage signal 33, having a value of −0.32 V, were added to signal 31 by adding means 32 then signal 38 would have a voltage level of 0.8 V, signal 45 would have a voltage level of 6.4 V, and signal 47 would have a voltage level of 51.2 V. Signal 45 would be selected by range selector 51 to be provided to sample-and-hold means 61. In this way, the largest usable input voltage level possible is employed in the A/D conversion, thus providing for a more accurate A/D conversion of data from chromatographic analyzer 11.

The low noise offset voltage signal 33 may also be utilized where signal 31 has a slightly negative voltage level of not more than −0.6 V. The low noise offset voltage signal 33 may be used to make signal 36 have a positive voltage level which can then be processed in the A/D conversion.

The initiate A/D conversion signal 62 from computer means 100 starts the A/D conversion process. In response to signal 62, range selector 51 connects the proper analog signal, either signal 38, signal 45 or signal 47, to sample-and-hold means 61 by closing the proper switch in switching system 41 via control signal 52, 53, or 54 respectively.

The sample-and-hold means 61 samples, at equally spaced intervals of time, the input analog signal applied thereto, holding the smapled value constant for each A/D conversion. The sample-and-hold delay 63 allows time for the switching transients in the sampled analog signal to settle before the hold is applied. Sample-and-hold delay 63 is activated by initiate A/D conversion signal 62 and communicates with sample-and-hold means 61 via control signal 64.

The sampled analog signal is supplied to analog-to-digital (A/D) converter 71 as signal 65. The A/D start pulse circuit 66 initiates the A/D conversion. The A/D start pulse circuit 66 is activated by signal 64 from sample-and-hold delay 63 and communicates with A/D converter 71 via control signal 67 to actuate the A/D converter 71.

Signal 65 is converted to a thirteen bit digital signal by A/D converter 71. The data is read from the A/D converter 71 by activating read-high data signal 72 and read-low data signal 73. The low-data byte consists of the eight least significant bits of the conversion. The high-data byte consists of the five most significant bits of the conversion plus two bits to signify the range which was used and an overrange bit to signify if the signal was out of range. The two bits to signify the range and the overrange bit are supplied as signal 75 by range converter 74 in response to signal 76 supplied by range selector 51. Read-high data signal 72 activates range converter 74. The sixteen bit digital data signal 77 is supplied to computer means 100.

Figure 2:
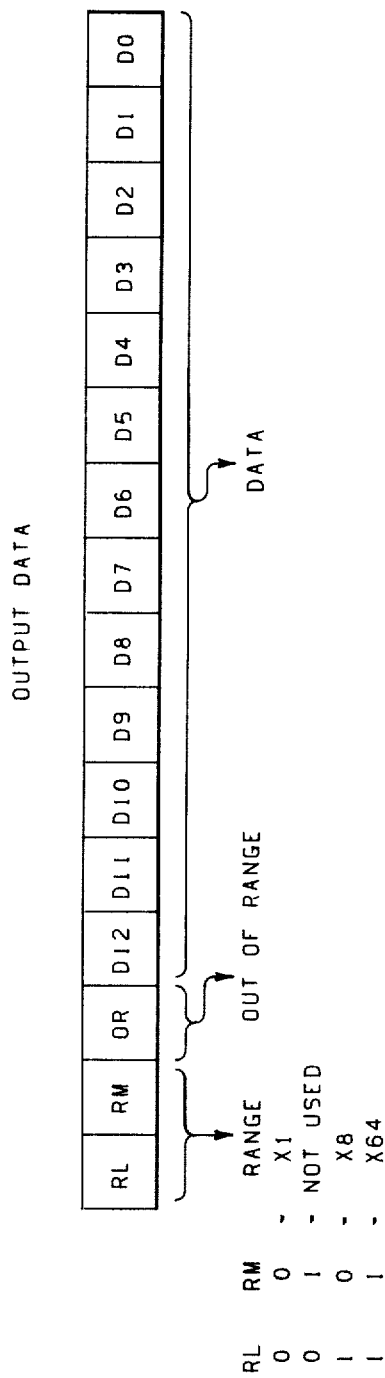
FIG. 2 is a representation of the data signal supplied by the analog-to-digital converter illustrated in FIG. 1A to the computer illustrated in FIG. 1A.

FIG. 2 is a representation of data signal 77. The least significant bit is defined as the data bit farthest to the right or the D0 position. The most significant bit is defined as the data bit farthest to the left or the RL position. Thus the low-data byte consist of data bits D7-D0. The high-data byte consists of data bits RL-D8. Data bits RL and RM represent the range selected data. The preferred logic used is shown in FIG. 2. However, any suitable logic could be utilized and the preferred logic is presented only as an example. Data bit OR represents the overrange bit. In a preferred embodiment, logic 0 is used to signify that the analog signal was in the proper range; logic 1 is used to signify that the analog signal was out of the proper range. This logic could of course be reversed. Data bits D12-D0 represent the thirteen bit digital conversion of analog signal 65.

Referring again to FIG. 1A, data signal 77 is processed as desired by computer means 100. Computer means 100 may be any computing means capable of supplying the required control signal and outputting either data or control signals in response to data signal 77. One such suitable computing means is the Motorola 6800 Microprocessor.

Figure 1B:
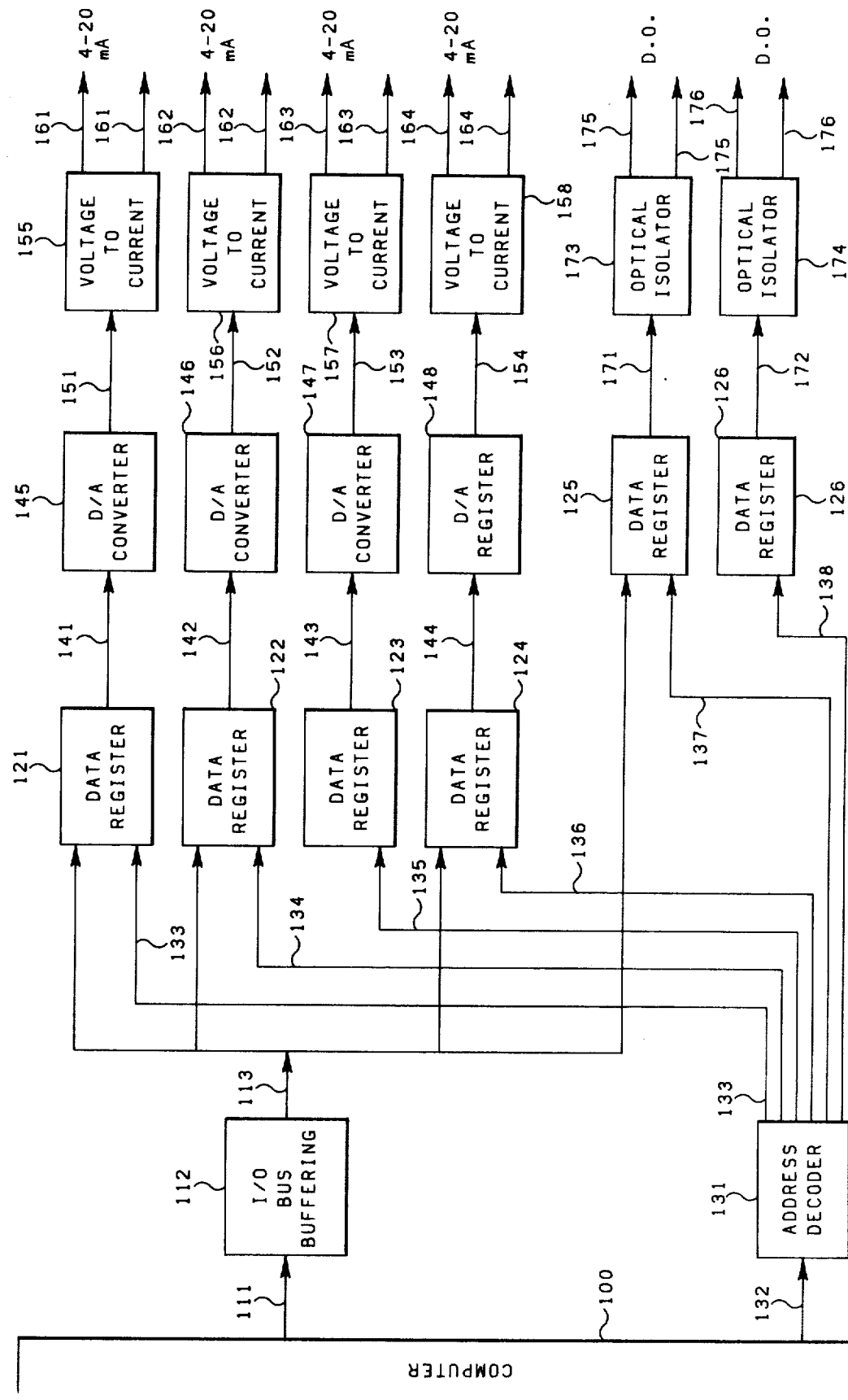
FIG. 1B is a block diagram of a computer system utilizing a digital-to-analog conversion system.

Referring now to FIG. 1B, the computer output data signal 111 is supplied to input/output bus buffer 112. The information carried by the output data signal 111 will vary according to the particular application. It may represent a control signal for some process or it may represent information to be output to a printer or another computer. The information carried by output data signal 111 is based on a processing of input data signal 77 by computer means 100. Input/output bus buffer 112 takes the output data signal 111 and buffers it. This process is well known in the art and may be likened to a current amplification of output data signal 111. Signal 113, representative of the buffered computer output data is then supplied to data registers 121, 122, 123, 124, 125 and 126. Several data registers may be used for each D/A converter if one data register does not have enough input lines. One data register for each D/A converter is shown for the sake of convenience. Address decoder 131 selects the data register to be used in response to address signal 132. Signal 133 from address decoder 131 allows the data register selected to accept data signal 113 and hold the data bits. The data bits are supplied to digital to analog (D/A) converter 145, 146, 147, or 148 on lines 141, 142, 143, or 144 respectively.

The D/A converter associated with the data register which has been selected by address decoder 131 converts the digital input signal to an analog output signal. Analog output signal 151, 152, 153, or 154 is supplied to voltage to current transducer 155, 156, 157, or 158 respectively. Voltage to current transducer 155, 156, 157, or 158 output an analog signal 161, 162, 163 or 164 respectively. The analog output signal 161, 162, 163, or 164 is a 4-20 milliamp loop with the negative side grounded in a preferred embodiment.

The analog output signal 161, 162, 163, or 164 may be used for many applications. For example, the analog output signal 161, 162, 163, or 164 may be used to control a process, drive a printer, or supply information to another computer. If it is desired that the information contained in the analog output signal 161, 162, 163, or 164 be supplied to a computer, then address decoder 131 enables either data register 125 or 126 allowing data register 125 or 126 to supply a signal 171 or 172 to drive either optical isolator 173 or 174, respectively. The optically isolated digital output signal from either optical isolator 173 or 174 tells another computer that information is available on an analog output channel and tells the other computer which channel to look to to access the information.

The invention has been described in terms of its presently preferred embodiment as is shown in the block diagram of FIG. 1. Many of the pieces of apparatus shown in FIG. 1 are off the shelf items which are commonly available from a variety of manufacturers. Other devices are specialized circuits specifically developed to accomplish the purposes of the invention.

A more detailed description of the invention as shown in FIG. 1 follows. Where commercial equipment is available to accomplish the functions of the apparatus shown in FIG. 1 this equipment is listed. Where specialized circuits were developed detailed schematics are illustrated and described.

Specified components which are available commercially and which can be used in the practice of the invention as shown in FIGS. 1A and B are as follows:

Chromatographic analyzer 11—Optichrome ® 2100 Process Chromatograph System, Applied Automation, Inc.

Buffer amplifier 14—LM308, National Semiconductor, Inc. OP-05, Precision Monolithics, Inc.

Differential amplifier 17—LM-307, National Semiconductor, Inc.

Summing means 32—No. B05885 Multi Use Amplifier Applied Automation, Inc.

Low pass filter 37 and 44—ATF76-L-2-16, Burr-Brown, Inc.

X8 Amplifier 42 and 46—AD510, Analog Devices, Inc.

Switching means 41—DG-201, Siliconix, Inc.

Sample and hold 61—AD532, Analog Devices, Inc.

A/D converter 71—AD 7550, Analog Devices, Inc.

Range amplifier 74—9LS367, Fairchild Semiconductor

Computer means 100—Motorola 6800 Microprocessor

Data registers 121, 122, 123, & 124—74LS174, Fairchild Semiconductor

D/A converters 145, 146, 147, & 148—AIM DAC 100, Precision Monolithics, Inc.

Data registers 125 and 126—74LS74, Fairchild Semiconductor

Voltage to current transducers 155, 156, 157, 158—D03700P1 165-748-1 Applied Automation, Inc.

Optical isolators 173 and 174—MCA-255, Monsanto, Inc.

Detailed schematics are presented in FIGS. 3, 4, 5, 6 and 9. For the sake of convenience signals which supply power to the various chips shown in the schematic have been omitted. Voltage levels required by various chips are specified by the manufacturer and are well known to those familiar with the art. Many different circuit configurations are possible which would perform the functions required of the circuits shown in FIGS. 3, 4, 5, 6, and 9. These figures present preferred embodiments of some of the devices shown in FIGS. 1A and B.

Figure 3:
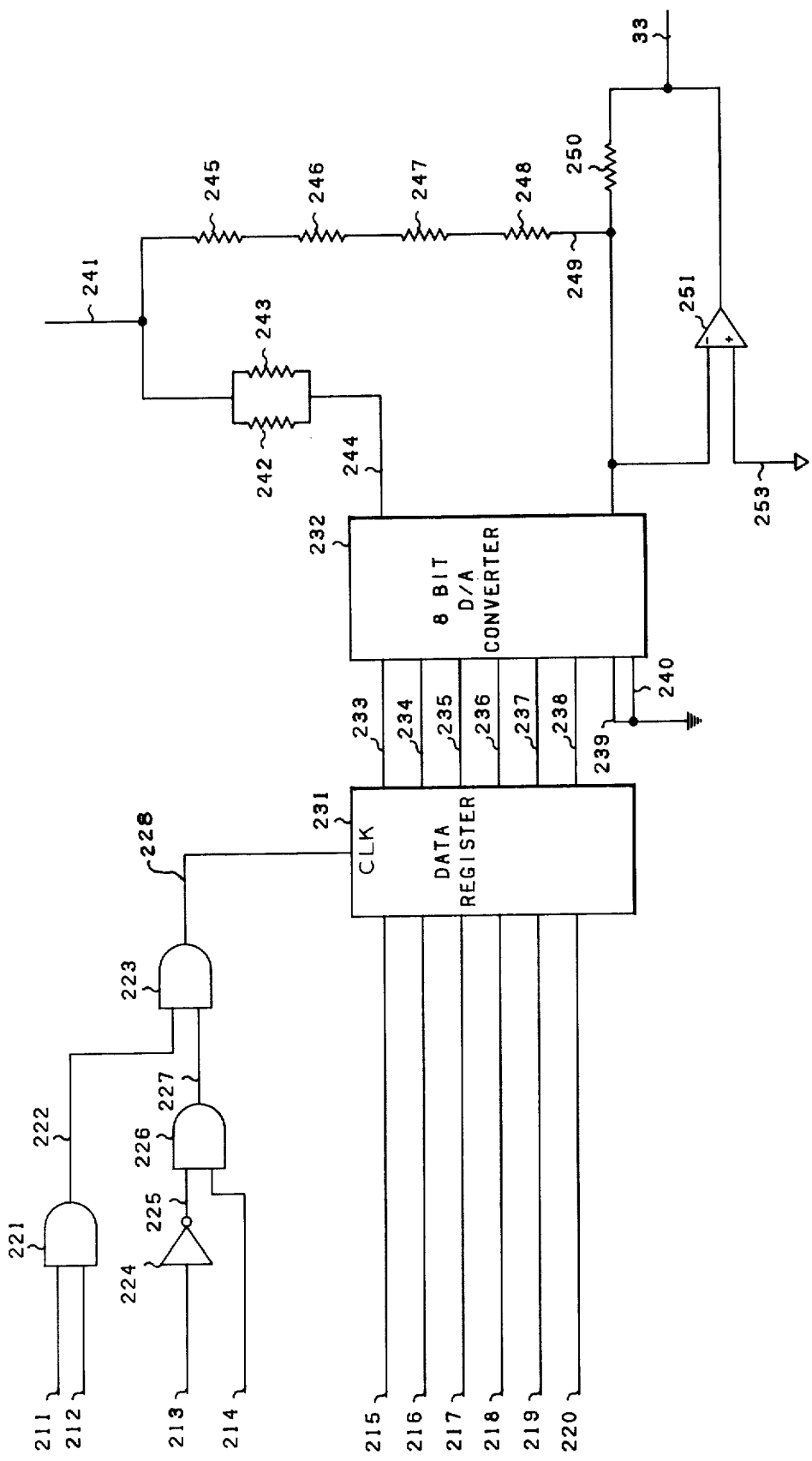
FIG. 3 is a schematic of the circuit used to perform the functions of the low noise offset voltage generator illustrated in FIG. 1A.

Referring now to FIG. 3 a schematic is shown of the low noise offset voltage generator 34 shown in FIG. 1A. Signal 211 is an output data signal which signifies that data is available to be input to data register 231. Signal 212 is the strobe signal. Signals 213–220, referred to as balance command signal 35 in the description of FIG. 1A, represent an eight bit data signal from computer means 100 shown in FIG. 1A. Signals 211–220 are digital signals. Signals 211 and 212 are provided to AND gate 221 as inputs. When data is available to be input to data register 231, signal 211 will be equal to logic 1 (high). At all other times signal 211 will be equal to logic 0 (low). When signal 211 is high and strobe signal 212 is high, then signal 222 from AND gate 221 will be high and will be provided as one input to AND gate 223. Signals 213 and 214 are the most significant bits of the eight bit data signal from computer means 100. Signal 213 is inverted by inverter 224. Thus if signal 213 is low, signal 225 from inverter 224 will be high. When signal 214 and signal 225, supplied to AND gate 226 are both high, then signal 227 from AND gate 226 will be high and will be provided as a second input to AND gate 223. When both signal 222 and 227 are high, then signal 228 from AND gate 223 will be high, thus enabling data register 231 and initiating the transfer of the data represented by the six least significant bits from data register 231 to D/A converter 232. Data is supplied to data register 231 by signals 215–220 and is transferred to D/A converter 232 via signals 233–238. The remaining two input ports 239 and 240 of D/A converter 232 are tied to ground.

Signal 241 has a voltage level of 10 volts. Resistors 242 and 243 are both 10 KΩ resistors. Thus signal 244 has a current level of 2 milliamps and is provided as a reference current to D/A converter 232.

Resistors 245, 246, 247, and 248 are all 10 KΩ resistors. Thus signal 249 has a current level of 0.25 milliamps. This current may flow either through resistor 250 which has a value of 2.5 KΩ or into D/A converter 232. Only negligible current may flow through operational amplifier 251.

Data signals 233–238 determine the amount of current which may flow into D/A converter 232. The current flow may range from a high of 0.492 milliamps when data signals 233–238 are all high to a low of zero milliamps or no current flow when data signals 233–238 are all low. The current which may flow into D/A converter 232 may be derived by taking the binary number represented by data signals 233–238, dividing it by the number 256 which is 2 raised to the power of 8, and multiplying it by the reference current of 2 milliamps. For example, if all the data signals 233–238 are high, then the number 63 is represented in binary and (63/256) (2 milliamps) = 0.492 milliamps or the high range of the current flow into the D/A converter 232.

Operational amplifier 251 has an analog ground 253 on its noninverting input and acts essentially as an inverter which drives the offset voltage signal 33. The offset voltage signal may range from −0.625 volts to +0.605 volts as has been stated. If all the data signals 233–238 are low then no current in drawn by D/A converter 232 and all current must flow through resistor 250. Since resistor 250 has a value of 2.5 KΩ and signal 249 has a current level of 0.25 milliamps the voltage level of offset voltage signal 33 will be −0.625 volts because of the inverting action of operational amplifier 251.

If all the data signals 233–238 are high then a current of 0.492 milliamps will be drawn by A/D converter 232. Since only 0.25 milliamps is available from signal 249, the operational amplifier 251 must supply the remaining 0.242 milliamps. This results in a current flow of 0.242 milliamps across the 2.5 KΩ resistor 250; thus the voltage level of offset voltage signal 33 will be 0.605 volts.

Offset voltage signal 33 is supplied to summing means 32 as has been previously described in FIG. 1A.

Figure 4:
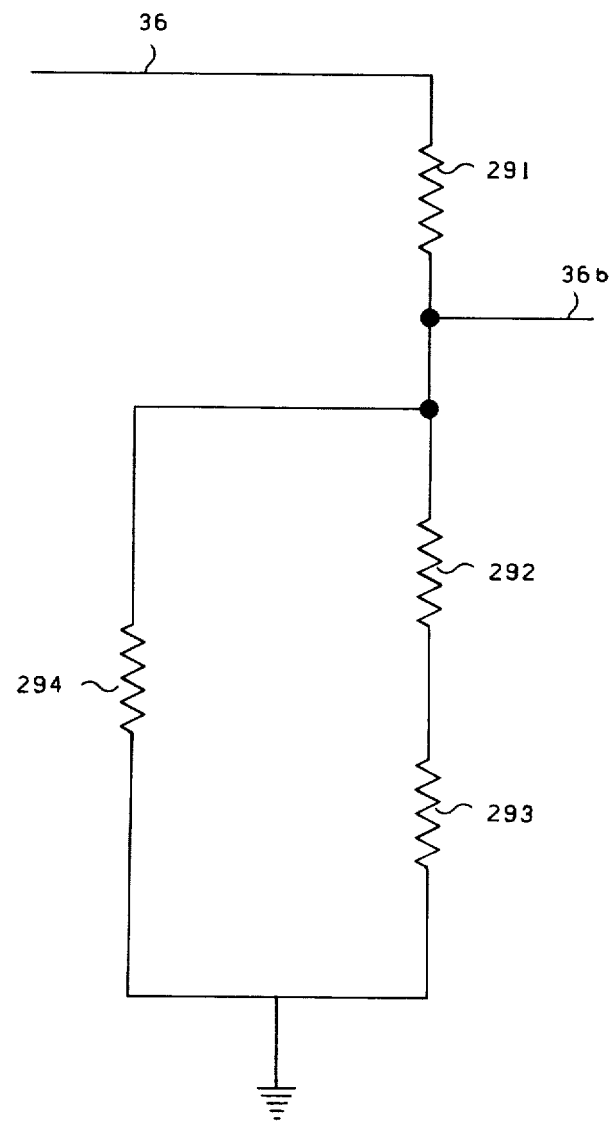
FIG. 4 is a schematic of the circuit used to perform the functions of the voltage divider illustrated in FIG. 1.

Referring now to FIG. 4 a schematic is shown of the voltage divider 36a shown in FIG. 1A. Obviously many different circuit configurations are possible. FIG. 4 is a presently preferred embodiment. Resistor 291 has a value of 1 KΩ. Resistors 292, 293, and 294 have values of 1 KΩ, 1 KΩ, and 10 KΩ respectively. The parallel combination of resistors 292, 293, and 294 and a value of 1.66 KΩ. If $R_1$ is made representative of resistor 291 and $R_2$ is made representative of resistors 292, 293, and 294 in parallel then the voltage level of signal 36b is given by the equation $$V = R_1/(R_1 + R_2)\ V_1$$

where
$V_1$ = voltage level of signal 36; and
$V$ = voltage level of signal 36b.

If $V_1 = 10.24$ volts then V will equal 6.4 volts with the resistance values specified.

Figure 5:
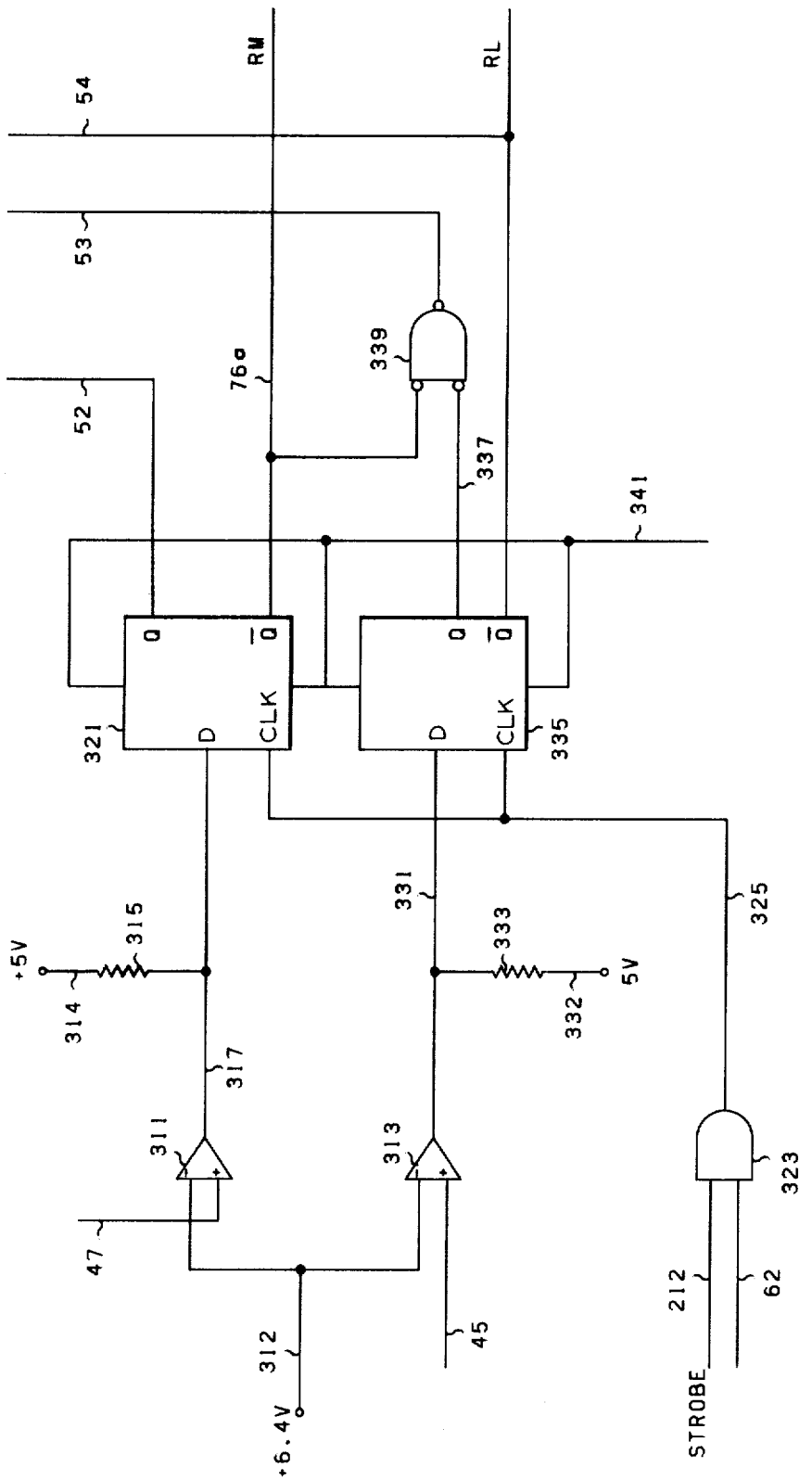
FIG. 5 is a schematic of the circuit used to perform the functions of the range selector illustrated in FIG. 1.

Referring now to FIG. 5 a schematic is shown of the range selector 51 shown in FIG. 1A. As was described in FIG. 1A, signal 47, representative of the voltage level of the analog data signal 38 from low pass filter 37 multiplied by a factor of 64, is supplied to range selector 51 and in particular is supplied to the positive input of comparator 311. Signal 45, representative of the voltage level of the analog data signal 38 from low pass filter 37 multiplied by a factor of 8, is also supplied to range selector 51 and in particular is supplied to the positive input of comparator 313. Signal 312 represents the maximum desirable input voltage level, in this instance a voltage level of 6.4 volts, and is supplied to the negative inputs of comparators 311 and 312.

As has been previously stated for the illustrated example, the allowable range of the analog data signal which is supplied to sample-and-hold means 61 is 0 to 6.4 volts. The analog data signal 38, 45, or 47 which has the highest voltage which does not exceed 6.4 volts will be selected for input into sample-and-hold means 61. If signal 47 is less than 6.4 volts, the output of comparator 311 will be low and will be essentially at ground. This will cause signal 317 to be low because the current from the 5-volt supply signal 314 will flow across the 10 KΩ resistor 315 to ground. If signal 47 is greater than 6.4 volts, the output of comparator 311 will be high and no current flow into comparator 311 will be possible. Signal 317 will thus be high. Signal 317 is supplied as one input to flip-flop 321.

Strobe signal 212, also shown in FIG. 3, is supplied as one input to AND gate 323. Initiate conversion signal 62, also shown in FIG. 1, is supplied as the second input to AND gate 323. When both initiate conversion signal 22 and strobe signal 212 are high, then the output signal 325 of AND gate 323 will be high. At all other times signal 325 will be low. Signal 325 is supplied as an input to flip-flop 321. When signal 325 is high and signal 47 is less than 6.4 volts, thus making signal 317 low, the flip-flop 321 will change states and signal 52 from the output labeled Q of flip-flop 321 will be low. As is shown in FIG. 1A signal 52 is supplied to switching means 41 and the switch associated with signal 47 will be closed when signal 52 is low. Signal 76a from the output labeled $\overline{Q}$ of flip-flop 321 is high when signal 52 is low. Signal 76a is part of the data provided by signal 76 to range amplifier 74 as is shown in FIG. 1.

If signal 47 is greater than 6.4 volts then signal 52 will be high and the switch associated with signal 47 in switching means 41 as shown in FIG. 1A will remain open. Signal 45 will then be tested to determine if it is less than 6.4 volts.

If signal 45 is less than 6.4 volts then the output of comparator 313 will be low and will be essentially at ground. This will cause signal 331 to be low because the current from the 5-volt supply signal 332 will flow across the 10 KΩ resistor 333 to ground. If signal 45 is greater than 6.4 volts, then the output of comparator 313 will be high and only negligible current flow into comparator 313 will be possible. Signal 331 will thus be high. Signal 331 is supplied as one input to flip-flop 335. Signal 325 is supplied as a second input of flip-flop 335.

When signal 325 is high and signal 45 is less than 6.4 volts, thus making signal 331 low, the flip-flop 335 will change states and signal 337 from the output labeled Q of flip-flop 335 will be low. Signal 337 is supplied as one input to operate low AND gate 339. Signal 76a is supplied as a second input to operate low AND gate 339. When signal 52 is high, signifying that signal 47 was out of range, then signal 76a will be low. Because of the inverting action applied to signals 337 and 76a before entering operate low AND gate 339, both signals 76a and 337 will be high and signal 53 will be low. Only when signal 76a is low, signifying that signal 47 was out of range, and signal 337 is low, signifying that signal 45 was within the proper range, will signal 53 be low.

As is shown in FIG. 1A, signal 53 is supplied to switching means 41 and the switch associated with signal 45 will be closed when signal 53 is low.

If signal 337 is high, signifying that both signals 47 and 45 were out of range, then signal 54 from the output labeled $\overline{Q}$ on flip-flop 335 will be low. Signal 54 is supplied to switching means 41 and the switch associated with signal 38 will be closed when signal 54 is low, as is shown in FIG. 1.

Signal 54 is also part of the data provided by signal 76 to range amplifier 74 as is shown in FIG. 1A. If signal 76a and signal 54 are both low, this signifies that signal 38 was selected to be used in the A/D conversion. If signal 76a is low and signal 54 is high, this signifies that signal 45 was selected to be used in the A/D conversion. Finally if both signal 76a and signal 54 are high, this signifies that signal 47 was selected to be used in the A/D conversion.

Signal 341 is high and insures that the remaining inputs on the particular flip-flops used remain high.

Figure 6:
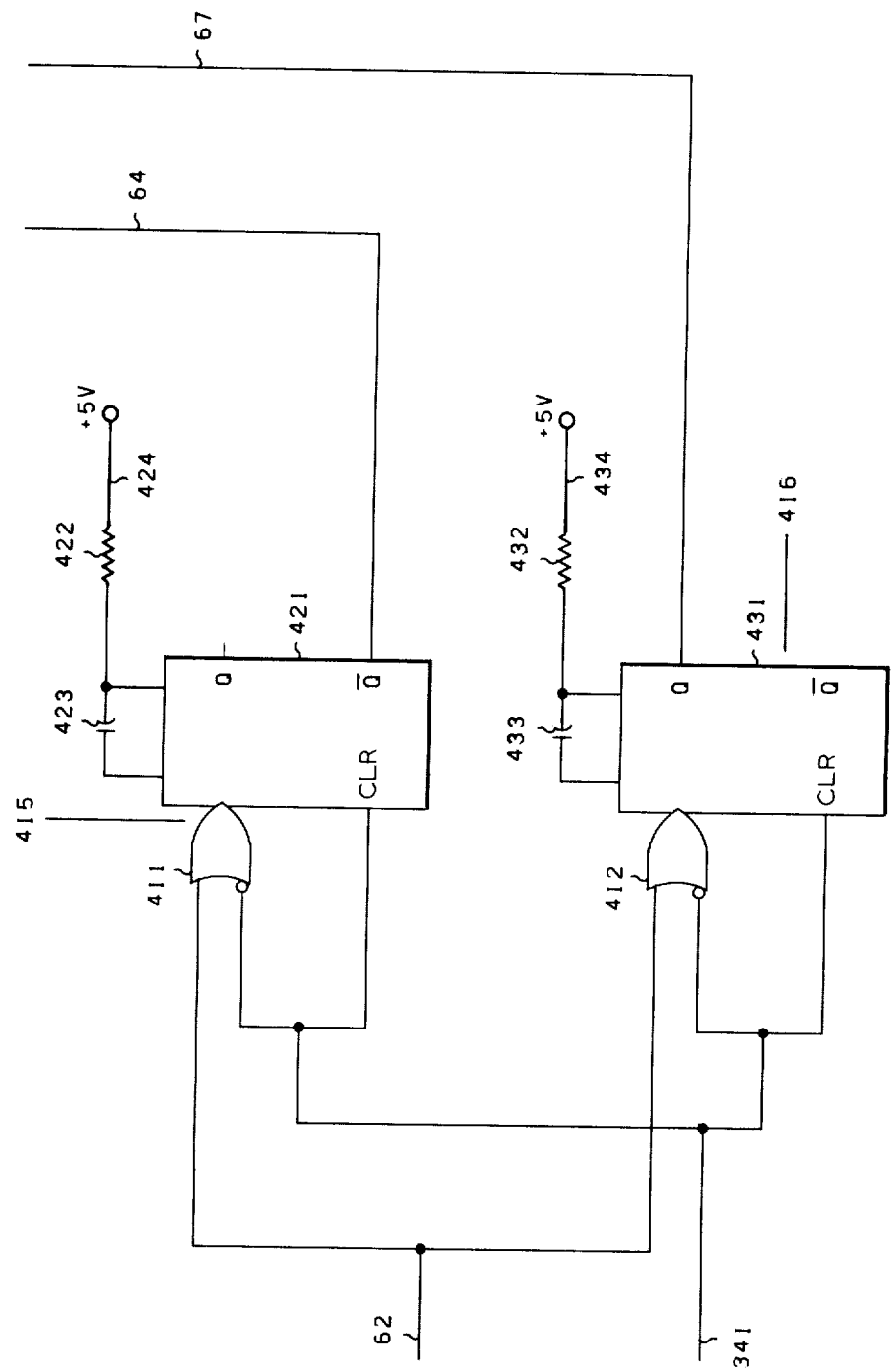
FIG. 6 is a schematic of the circuits utilized to perform the functions of the sample-and-hold delay and the initiation of the analog-to-digital conversion illustrated in FIG. 1.

Referring now to FIG. 6 a schematic is shown of the sample-and-hold delay 63 and the A/D delay 66 illustrated in FIG. 1A. Devices 415 and 416 are referred to in the art as "one shots". They are formally called retriggerable resettable monostable multivibrators. The particular device used in a preferred embodiment is a Model 96L02 manufactured by Fairchild. Devices 415 and 416 may be conveniently described as an OR gate 411 or 412 in conjunction with a flip-flop 421 or 431 with the special property of being able to deliver a pulse of some specified duration. This will be done for the sake of convenience and clarity of the description.

Initiate conversion signal 62, referred to in FIG. 1A, is supplied as one input to OR gates 411 and 412. Signal 341 which is always high is supplied as the other input to OR gates 411 and 412 but is inverted before being supplied to OR gates 411 and 412 so that it is always a low input. When initiate conversion signal 62 is high the output signal of OR gate 411 will be high. At all other times the output signal of OR gate 411 will be low. The output signal of OR gate 411 is supplied as one input to flip-flop 421. Signal 341 is supplied as the other input to flip-flop 421.

When the output signal of OR gate 411 is low the output of the output port labeled Q on flip-flop 421 will be low thus the output of the output port labeled $\overline{Q}$ on flip-flop 421 will be high. When the output signal of OR gate 411 is high the flip-flop 421 will change states and the output of the output port labeled $\overline{Q}$ on flip-flop 421 will be low. Signal 64 represents the output of the output port labeled $\overline{Q}$ on flip-flop 421 and is supplied to sample-and-hold means 61, as has been previously described in FIG. 1A.

Before the initiate conversion signal 62 goes high, signal 64 will be high. When initiate conversion signal 62 goes high, signal 64 will go low for a period of time determined by the values of resistor 422 and capacitor 423 which are connected to the 5-volt supply signal 424.

For the Fairchild Model 96L02 the equation for the pulse period is $$T = 0.3(R)(C)$$

where
T = time in nanoseconds;
R = resistance in KΩ; and
C = capacitance in picofarads.

In a preferred embodiment resistor 422 has a value of 100 KΩ and capacitor 423 has a value of 0.1 μf thus yielding a pulse of 3.0 MSEC duration.

Figure 7:
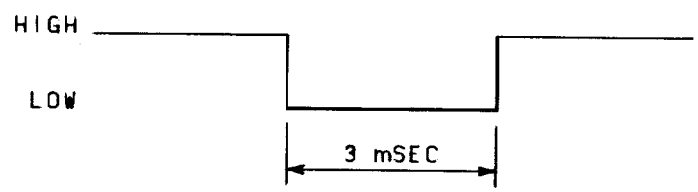
FIG. 7 is a representation of the waveform generated by the sample-and-hold delay illustrated in FIG. 6.

The shape of the pulse is shown in FIG. 7. When the pulse is low, sample-and-hold means 61, shown in FIG. 1A, will sample the analog data signal supplied to it. When the pulse goes high again, sample-and-hold means 61 will hold the sampled data. This allows the analog data signal to settle before it is held.

When initiate conversion signal 62 is high the output signal of OR gate 412 will be high. At all other times the output signal of OR gate 412 will be low. The output signal of OR gate 412 is supplied as one input to flip-flop 431. Signal 341 is supplied as the other input to flip-flop 431. When the output signal of OR gate 412 is low the output of the output port labeled Q on flip-flop 431 will be low. When the output signal of OR gate 412 is high the flip-flop 431 will change states and the output of the output port labeled Q on flip-flop 431 will be high. Signal 67 represents the output of the output port labeled Q on flip-flop 431 and is supplied to analog to digital converter 71 as has been previously described.

Figure 8:
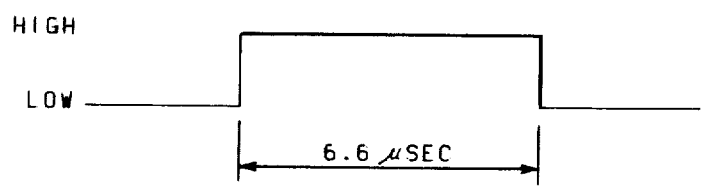
FIG. 8 is a representation of the waveform generated by the analog-to-digital conversion initiation circuit illustrated in FIG. 6.

Before the initiate conversion signal 62 goes high, signal 67 will be low. When initiate conversion signal 62 goes high, signal 67 will go high for a period of time determined by the values of resistor 432 and capacitor 433 which are connected to the 5-volt supply signal 434. In a preferred embodiment resistor 432 has a value of 22 K$\Omega$ and capacitor 433 has a value of 1000 pf thus yielding a pulse of 6.6 $\mu$sec duration for the Fairchild Model 96L02. The shape of the pulse is shown in FIG. 8.

Figure 9:
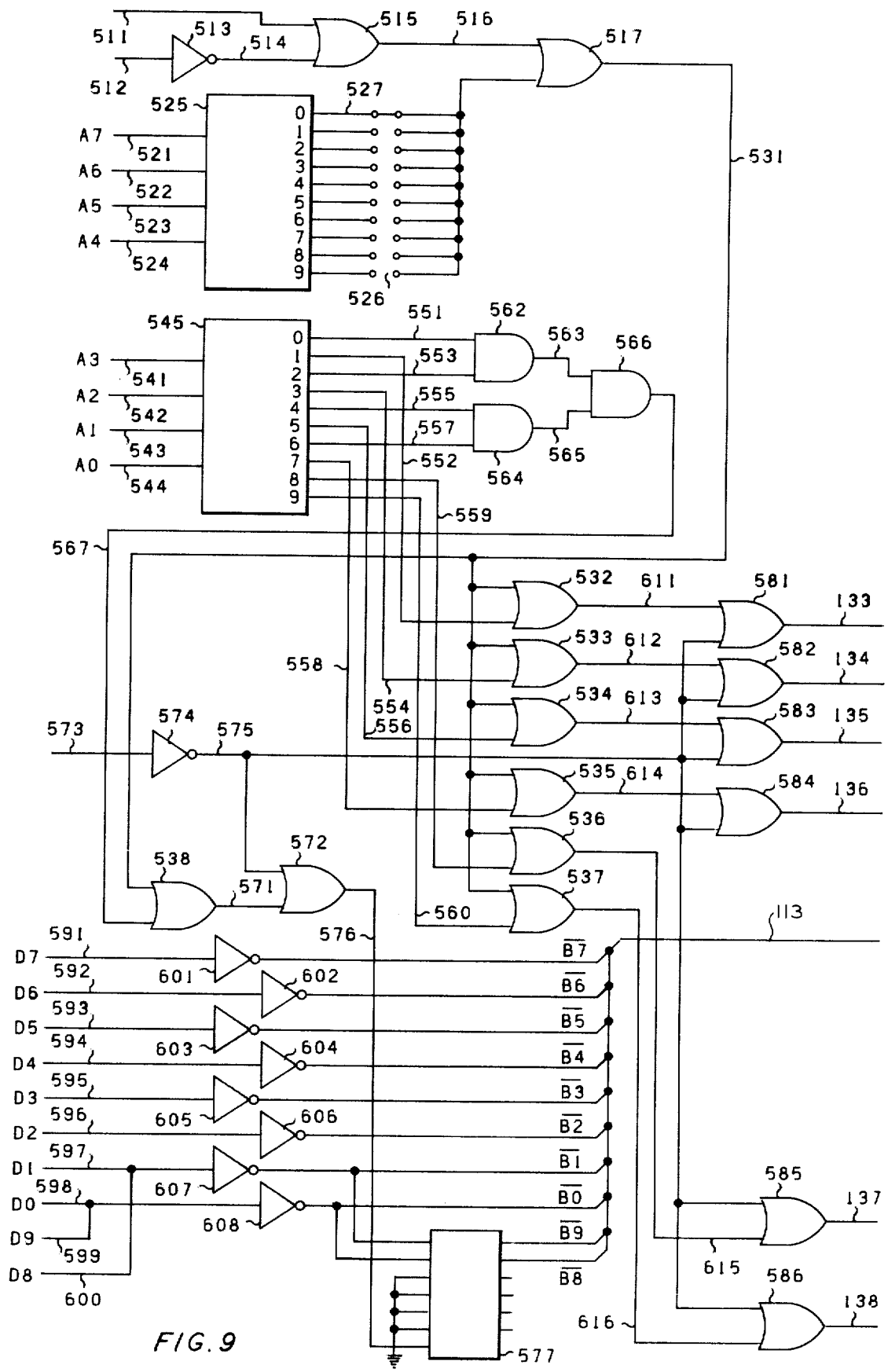
FIG. 9 is a schematic of the circuit utilized to perform the functions of the input/output bus buffering and the address decoder llustrated in FIG. 1B.

Referring now to FIG. 9 a schematic is shown of the address decoder 131 and the input/output bus buffer 112 shown in FIG. 1B. Signal 511 is an enabling signal from computer means 100 which is low when data is available to be written out to the data registers 121, 122, 123, 124, 125, and 126 shown in FIG. 1B. Signal 512 is an address enable signal which goes high to enable address decoder 131. Signal 512 is inverted by inverter 513 to produce signal 514. Signals 511 and 514 are provided to OR gate 515 as inputs. The output signal 516 from OR gate 515 will be low when signal 511 is low and signal 514 is low. Signal 516 is provided as one input to OR gate 517.

An 8-bit address signal 132 from computer means 100 is provided to address decoder 131 as is shown in FIG. 1B. The four most significant bits are utilized to determine which D/A converter card should be used where there are a number of D/A converter cards in a system. The four least significant bits are used to select the appropriate output data register shown in FIG. 1B.

Signals 521, 522, 523, and 524 represent the four most significant bits of the 8-bit address decode signal 132 and are provided to a four bit to ten bit decoder 525. The four bit to ten bit decoder 525 decodes the four bit address represented by signals 521-524 and enables the proper output line in response to the four bit address. For example, if the four bit address is 0000 then output line 527 representing the 0 output line is enabled or is low in this preferred embodiment.

In this preferred embodiment only one D/A converter card is shown made up of four D/A converters. For the sake of illustration strapping means 526 has been strapped so that an address of 0000 will select the D/A converter card shown in FIG. 1B. When signals 521-524 represent the binary pattern 0000 then signal 527 will be low. Signal 527 is provided as an input to OR gate 517. When signals 516 and 527 are both low then the output signal 531 of OR gate 517 will be low. Signal 531 is provided an one input to OR gates 532-538.

Signals 541, 542, 543, and 544 represent the four least significant bits of the eight bit address signal 132 and are provided to a four bit to ten bit decoder 545. The four bit to ten bit decoder 545 decodes the four bit address made up of signals 541-544 and enables the output line which is represented by the binary input signal. Thus if a binary signal 0000 is input, output line 0 is enabled or is low in this preferred embodiment.

If data register 121 shown in FIG. 1B has been selected, then signals 541-544 will first represent the binary pattern 0000. Signal 551 will be low. All other signals from four bit to ten bit decoder 545 will be high. Signal 551 is provided as one input to AND gate 562;

signal 553 is provided as the other input signal. Since signal 551 is low, signal 563 from AND gate 562 will also be low.

Signals 555 and 557 are provided as inputs to AND gate 564. Since both signal 555 and signal 557 are high, signal 565 from AND gate 564 will be high. Signals 563 and 565 are provided as inputs to AND gate 566. Since signal 563 is low, signal 567 from AND gate 566 will be low. Signal 567 is provided as a second input to OR gate 538. Since both signal 531 and signal 567 are low, the output signal 571 of OR gate 538 will be low. Signal 571 is provided as an input to OR gate 572.

Signal 573 is a clock signal. Clock signal 573 is inverted by inverter 574 to form signal 575. Signal 575 is provided as a second input to OR gate 572 and is provided as an input to OR gates 581, 582, 584, 585, and 586. When clock signal 573 is high, signal 575 will be low and the output signal 576 of OR gate 572 will be low. Signal 576 enables data register 577 when it is low.

In this preferred embodiment, 10 data bits are output by computer means 100. The two most significant bits and the two least significant bits share common output lines. When signals 541-544 represent the binary pattern 0000 then the two most significant data bits, signals 599 and 600, are transmitted by computer means 100 to data register 577, which has been enabled by signal 576m, and are stored in data register 577. When signals 541-544 is changed to represent the binary pattern 0001, then the remaining 8 last significant data bits are transmitted and all 10 bits form data signal 113 shown in FIG. 1. All data signals 591-600 are inverted and amplified by buffer amplifiers 601-608. This process is called buffering.

When signals 541-544 change to the binary pattern 001, then signal 552, from four bit to ten bit decoder 545, goes low and all other signals from decoder 545 go high. Signal 552 is provided as a second input to OR gate 532. Since both signals 531 and 552 are low, signal 611 from OR gate 532 will be low. Signal 611 is provided as a second input to OR gate 581. Since both signals 611 and 575 are low, signal 133 from OR gate 581 will be low. Signal 133 enables data register 121 as is shown in FIG. 1. Data signal 113 is clocked into data register 121 on the rising edge of signal 133.

The same sequence is followed for each of the remaining data registers 122, 123, and 124 shown in FIG. 1B. If data register 122 has been selected, then signals 541-544 will first represent the binary pattern 0010. Signal 553 will be low which will enable data register 577. The binary pattern of signals 541-544 will then change to 0011 and signal 554 will go low. Signal 612 from OR gate 533 will go low thus causing signal 134 from OR gate 582 to go low. Data signal 113 is clocked into data register 122 on the rising edge of signal 134.

If data register 122 has been selected, then signals 541-544 will first represent the binary pattern 0100. Signal 555 will be low which will enable data register 577. The binary pattern of signals 541-544 will then change to 0101 and signal 556 will go low. Signal 613 from OR gate 534 will go low thus causing signal 135 from OR gate 583 to go low. Data signal 113 is clocked into data register 123 on the rising edge of signal 135.

If data register 124 has been selected then signals 541-544 will first represent the binary pattern 0110 and signal 557 will go low which will enable data register 577. The binary pattern of signals 541-544 will then change to 0111 and signal 558 will go low. Signal 614 from OR gate 535 will go low thus causing signal 136 from OR gate 584 to go low. Data signal 113 is clocked into data register 124 on the rising edge of signal 136.

If data register 125 has been selected, then signals 541-544 will represent the binary pattern 1000 and signal 559 will go low. This causes signal 615 from OR gate 536 to go low thus causing signal 137 from OR gate 585 to go low. The least significant bit of data signal 113 is clocked into data register 125 on the rising edge of signal 137.

If data register 126 has been selected, then signals 541-545 will represent the binary pattern 1001 and signal 560 will go low. This causes signal 616 from OR gate 537 to go low thus causing signal 138 from OR gate 586 to go low. The least significant bit of data signal 113 is clocked into data register 126 on the rising edge of signal 138.

FIG. 3 presents the presently preferred embodiment of the low noise offset voltage generator illustrated in FIG. 14. Specific components which can be used in the low noise offset voltage generator as shown in FIG. 3 are as follows:

AND gates 221, 223 and 226—74LS08, Fairchild Semiconductor
    Inverter 224—9LS02, Fairchild Semiconductor
    Data register 231—74LS174, Fairchild Semiconductor
    8 bit D/A converter 232—AD559, Analog Devices
    Operational amplifier 251—LM307, National Semiconductor Resistance values were previously specified and are readily available from a number of manufacturers.

The resistance values utilized in the voltage divider illustrated in FIG. 4 have also been previously specified and are also readily available from a number of manufacturers.

FIG. 5 presents the presently preferred embodiment of the range selector illustrated in FIG. 1A. Specific components which can be used in the range selector as shown in FIG. 5 are as follows:

Comparators 311 and 313—LM311, National Semiconductor
    AND gate 323—74LS08, Fairchild Semiconductor
    Flip-flops 321 and 335—74LS74, Fairchild Semiconductor
    Operate low AND gate 339—74LS32, Fairchild Semiconductor FIG. 6 presents the presently preferred embodiment of the sample-and-hold delay and the analog-to-digital initiation circuit illustrated in FIG. 1A. Specific components which can be utilized in the sample-and-hold delay and the analog-to-digital conversion delay as shown in FIG. 6 are as follows:

One shot 415 and 416—06L02, Fairchild Semiconductor

Capacitors and resistors values were previously specified and are available from a number of manufacturers.

FIG. 9 presents the presently preferred embodiment of the input/output buffering and the address decoder illustrated in FIG. 1B. Specific components which can be utilized in the input/output buffering and the address decoder as shown in FIG. 9 are as follows:

Or gates 515, 517, 532-538, 572, and 581-586—9LS32, Fairchild Semiconductor
    AND gates 562, 564 and 566—74LS08, Fairchild Semiconductor
    Inverters 512 and 601-608—74LS04, Fairchild Semiconductor
    Four bit to ten bit decoders 525 and 545—74LS42, Fairchild Semiconductor
    Data register 577—74LS174, Fairchild Semiconductor While the invention has been described in terms of the presently preferred embodiments, reasonable variations and modifications are possible by those skilled in the art, within the scope of the described invention and the appended claims.

That which is claimed is:

1. Apparatus comprising:
    means for producing a first analog signal;
    means for producing an offset voltage signal;
    means for combining said first analog signal and said offset voltage signal to produce a second analog signal;
    first amplifier means;
    means for providing said second analog signal as an input to said first amplifier means to thereby establish an amplified second analog signal having a first predetermined relationship to said second analog signal;
    an analog-to-digital converter means;
    means for establishing a third analog signal representative of the highest voltage level desirable as an input signal into said analog-to-digital converter means;
    means for comparing said amplified second analog signal to said third analog signal and for providing said amplified second analog signal as an input signal to said analog-to-digital converter means to be converted into a first digital signal if the voltage level of said amplified second analog signal does not exceed the voltage level of said third analog signal;
    means for providing said second analog signal as an input signal to said analog-to-digital converter means to be converted into a first digital signal if the voltage level of said amplified second analog signal exceeds the voltage level of said third analog signal, said offset voltage signal having a voltage level which will reduce the voltage level of said first analog signal to enable said amplified second analog signal to be provided as an input to said analog-to-digital converter means if the difference between the voltage level of said first analog signal, multiplied by the amplification factor of said first amplifier means, and the voltage level of said third analog signal does not exceed the maximum available absolute voltage level of said offset voltage signal multiplied by the amplification factor of said first amplifier means.

2. Apparatus in accordance with claim 1 wherein said means for comparing said amplified second analog signal to said third analog signal and for providing said amplified second analog signal as an input to said analog-to-digital converter means comprises:
    a first switching means having an input terminal and an output terminal;
    a comparator means having first and second input terminals and an output terminal;
    means for supplying said amplified second analog signal to the input terminal of said first switching means and to the first input terminal of said comparator means;
    means for connecting said analog-to-digital converter means to the output terminal of said first switching means;

means for supplying said third analog signal to the second input terminal of said comparator means;

flip-flop means having first and second input terminals and first and second output terminals;

means for establishing a fourth analog signal having a constant current level which will flow into the output terminal of said comparator means if said third analog signal has a voltage level greater than or equal to the voltage level of said amplified second analog signal or which will flow into the first input terminal of said flip-flop means if said third analog signal has a voltage level less than the voltage level of said amplified second analog signal;

means for establishing a clock signal;

means for connecting the second input terminal of said flip-flop means to said clock signal; and means for closing said first switching means in response to the output signal from the first output terminal of said flip-flop means if the output signal of the first terminal of said flip-flop means has a predetermined logic value.

3. Apparatus in accordance with claim 2 wherein said means for providing said second analog signal to said analog-to-digital converter means comprises:

a second switching means having an input terminal and an output terminal;

means for supplying said second analog signal to the input terminal of said second switching means;

means for connecting said analog-to-digital converter means to the output terminal of said second switching means; and means for closing said second switching means in response to the output signal from the second output terminal of said flip-flop means if the output signal of the second output terminal of said flip-flop means has a predetermined logic value.

4. Apparatus in accordance with claim 1 wherein said means for producing said offset voltage signal comprises a means for automatically controlling the amount of current flowing through a resistor means of known value to produce said offset voltage signal representative of the voltage level across said resistor means.

5. Apparatus in accordance with claim 1 wherein said means for producing said offset voltage signal comprises:

means for establishing a digital command signal representative of the required voltage level of said offset voltage signal;

a digital-to-analog converter means having an input terminal and first and second output terminals;

means for providing said digital command signal to the input terminal of said digital-to-analog converter means;

means for establishing a sixth analog signal representative of a constant current reference and means for providing said sixth signal to the first output terminal of said digital-to-analog converter means;

a resistor means having an input terminal and an output terminal;

means for establishing a seventh analog signal representative of a constant current source and means for providing said seventh analog signal to the second output terminal of said digital-to-analog converter means and to the input terminal of said resistor means;

means for establishing the current flow from said seventh analog signal which must be supplied to said digital-to-analog converter means and thus establishing said offset voltage signal which is representative of the voltage level across said resistor means which is determined by the current from said seventh analog signal which flows across said resistor means; and an operational amplifier means to supply current through said resistor means to said digital-to-analog converter means if the current flow from said seventh analog signal which must be supplied to said digital-to-analog converter means exceeds the current available from said seventh analog signal thus allowing said offset voltage signal to have a positive or negative voltage level whichever may be desired.

6. Apparatus in accordance with claim 1 wherein said means for establishing said second analog signal in response to said first analog signal and said offset voltage signal is a summing means.

7. Apparatus in accordance with claim 1 additionally comprising:

a second amplifying means for producing a fourth analog signal having a second predetermined relationship to said second analog signal, said fourth analog signal having a higher voltage level than said amplified second analog signal; and means for comparing said fourth analog signal to said third analog signal, for providing said second analog signal as an input signal to said analog-to-digital converter means to be converted into a first digital signal if the voltage level of said fourth analog signal does not exceed the voltage level of said third analog signal, and for preventing said amplified second analog signal from being supplied as an input signal to said analog-to-digital converter means if said fourth analog signal has a voltage level less than said third analog signal, said offset voltage signal having a voltage level which will reduce the voltage level of said first analog signal to enable said fourth analog signal to be provided as an input to said analog-to-digital converter means if the difference between the voltage level of said first analog signal, multiplied by the amplification factor of said second amplifier means, and the voltage level of said third analog signal does not exceed the maximum available absolute voltage level of said offset voltage signal multiplied by the amplification factor of said second amplifier means.

8. Apparatus in accordance with claim 7 wherein said means for comparing said fourth analog signal to said third analog signal and for providing said fourth analog signal as an input to said analog-to-digital converter means comprises:

a first switching means having an input terminal and an output terminal;

a first comparator means having first and second input terminals and an output terminal;

means for supplying said fourth analog signal to the input terminal of said first switching means and to the first input terminal of said first comparator means;

means for connecting said analog-to-digital converter means to the output terminal of said first switching means;

means for supplying said third analog signal to the second input terminal of said first comparator means;

first flip-flop means having first and second input terminals and first and second output terminals;

means for establishing a fifth analog signal having a constant current level which will flow into the output terminal of said first comparator means if said third analog signal has a voltage level greater than or equal to the voltage level of said fourth analog signal or which will flow into the first input terminal of said first flip-flop means if said third analog signal has a voltage level less than the voltage level of said fourth analog signal;

means for establishing a clock signal;

means for connecting the second input terminal of said first flip-flop means to said clock signal; and means for closing said first switching means in response to the output signal from the first output terminal of said first flip-flop means if the output signal of the first terminal of said first flip-flop means has a predetermined logic value.

9. Apparatus in accordance with claim 8 wherein said means for comparing said amplified second analog signal to said third analog signal and for providing said amplified second analog signal as an input to said analog-to-digital converter means comprises:

a second switching means having an input terminal and an output terminal;

a second comparator means having first and second input terminals and an output terminal;

means for supplying said amplified second analog signal to the input terminal of said second switching means and to the first input terminal of said second comparator means;

means for connecting said analog-to-digital converter means to the output terminal of said second switching means;

means for supplying said third analog signal to the second input terminal of said second comparator means;

second flip-flop means having first and second input terminals and first and second output terminals;

means for establishing a sixth analog signal having a constant current level which will flow into the output terminal of said second comparator means if said third analog signal has a voltage level greater than or equal to the voltage level of said amplified second analog signal or which will flow into the first input terminal of said second flip-flop means if said third analog signal has a voltage level less than the voltage level of said amplified second analog signal;

means for connecting the second input terminal of said second flipflop means to said clock signal;

an operate low AND gate means having first and second input terminals and an output terminal;

means for connecting the second output terminal of said first flipflop means to the first input terminal of said operate low AND gate means;

means for connecting the first output terminal of said second flipflop means to the second input terminal of said operate low AND gate means; and means for closing said second switching means in response to the output signal from the output terminal of said operate low AND gate means if the output signal of the output terminal of said operate low AND gate means has a predetermined logic value.

10. Apparatus in accordance with claim 9 wherein said means for providing said second analog signal to said analog-to-digital converter means comprises:

a third switching means having an input terminal and an output terminal;

means for supplying said second analog signal to the input terminal of said third switching means;

means for connecting said analog-to-digital converter means to the output terminal of said third switching means; and means for closing said third switching means in response to the output signal from the second output terminal of said second flip-flop means if the output signal of the second output terminal of said second flip-flop means has a predetermined logic value.

11. Apparatus in accordance with claim 1 additionally comprising:

a first filter means for removing noise from said second analog signal;

a second filter means for removing noise from said amplified second analog signal;

a sample and hold means for sampling said second analog signal or said amplified second analog signal and holding the sampled data from said second analog signal or said amplified analog signal until the analog-to-digital conversion is initiated by said analog to digital converter means;

first delaying means for delaying the holding of said sampled data from said second analog signal or said amplified second analog signal by said sample and hold means until said sampled data has settled; and means for initiating the analog-to-digital conversion by said analog-to-digital converter means.

12. Apparatus in accordance with claim 11 wherein said first delaying means for delaying the holding of said sampled data and said means for initiating the analog-to-digital conversion is a first and second one shot means respectively.

13. Apparatus in accordance with claim 7 additionally comprising:

a first filter means for removing noise from said second analog signal;

a second filter means for removing noise from said amplified second analog signal;

a sample and hold means for sampling said second analog signal said amplified second analog signal, or said fourth analog signal and holding the sampled data from said second analog signal, said amplified second analog signal, or said fourth analog signal until the analog-to-digital conversion is initiated by said analog-to-digital converter means;

first delaying means for delaying the holding of said sampled data from said second analog signal, said amplified second analog signal, or said fourth analog signal by said sample and hold means until said sampled data has settled; and means for initiating the analog-to-digital conversion by said analog-to-digital converter means.

14. Apparatus in accordance with claim 13 wherein said first delaying means for delaying the holding of said sampled data and said means for initiating the analog-to-digital conversion is a first and second one-shot means respectively.

15. Apparatus in accordance with claim 1 additionally comprising:

a first digital computer means for processing said first digital signal output from said analog-to-digital converter means, for outputting a second digital signal in response to said first digital signal, and for producing control signals to route said second digital signal to a desired destination;

a plurality of digital-to-analog converter means, for receiving and converting a digital signal to an analog signal and for supplying said analog signal to a desired destination;

a plurality of first data register means, for receiving said second digital signal from said first digital computer means and supplying said second digital signal to at least a respective one of said plurality of said digital-to-analog converter means;

means for connecting the input terminal of each one of said plurality of said digital-to-analog converter means to the output teminal of a respective one of said plurality of said first data register means;

means for providing said second digital signal to the first input terminal of said plurality of said first data register means; and means for automatically selecting one of said plurality of said first data register means to be enabled and for providing a first enabling signal having a predetermined logic value from said first digital computer means to the second input of the selected one of said plurality of said first data register means to enable the selected one of said plurality of said first data register means and initiate the digital-to-analog conversion of said second digital signal.

16. Apparatus in accordance with claim 15 wherein said means for providing said second digital signal to the first input terminal of said plurality of said first data register means comprises buffer amplifier means used to buffer said second digital signal and to supply said buffered second digital signal to said plurality of first input terminals of said first data register means.

17. Apparatus in accordance with claim 15 wherein said means for providing said second digital signal to the first input terminal of said plurality of said first data register means where there are more data bits present in said second digital signal than there are output lines from said first digital computer means comprises: p1 a first OR gate means having first and second input terminals and an output terminal;

a first inverter means having an input terminal and an output terminal;

means for connecting said first digital computer means to the first input terminal of said first OR gate means and for supplying a third digital signal, which is equal to logic 0 when said second digital signal is available to be written out to said plurality of said first data register means, from said first digital computer means to the first input of said first OR gate means;

means for connecting said first digital computer means to the input terminal of said first inverter means and for supplying an address enable digital signal, which is equal to logic 1 when it is desired to enable the digital-to-analog conversion process for said second digital data signal, from said first digital computer means to the input of said first inverter means;

means for connecting the output terminal of said first inverter means to the second input terminal of said first OR gate means;

a four bit to ten bit decoder means having first, second, third, and fourth input terminals and first through tenth output terminals;

means for supplying a four bit digital address signal from said first digital computer means to said first, second, third, and fourth input terminals of said four to ten bit decoder means;

a first AND gate means having first and second input terminals and an output terminal;

a second AND gate means having first and second input terminals and an output terminal;

a third AND gate means having first and second input terminals and an output terminal;

means for connecting the first and third output terminals of said four bit to ten bit decoder means to the first and second inputs respectively of said first AND gate means;

means for connecting the fifth and seventh output terminals of said four bit to ten bit decoder means to the first and second inputs respectively of said second AND gate means;

means for connecting the output terminal of said first AND gate means to the first input terminal of said third AND gate means and for connecting the output terminal of said second AND gate means to the second input terminal of said third AND gate means;

second OR gate means having first and second input terminals and an output terminal;

means for connecting the output terminal of said first OR gate means to the first input terminal of said second OR gate means and for connecting the output terminal of said third AND gate means to the second input terminal of said second OR gate means;

third OR gate means having first and second input terminals and an output terminal;

means for establishing a clock signal;

second inverter means having an input terminal and an output terminal;

means for supplying said clock signal to the input terminal of said second inverter means;

means for connecting the output terminal of said second inverter means to the first input terminal of said third OR gate means and for connecting the output terminal of said second OR gate means to the second input terminal of said third OR gate means;

a second data register means having first and second input terminals and an output terminal;

means for supplying the most significant bits of said second digital signal to the first input of said second data register means;

means for connecting the output terminal of said third OR gate means to the second input of said second register means to provide an enabling signal to said second data register means;

means for storing the most significant bits of said second digital signal in said second data register means until the least significant bits of said second digital signal have also been transmitted from said first digital computer means and then combining the most significant bits and the least significant bits of said second digital signal for transmission to the first input terminal of said plurality of said first data register means.

18. Apparatus in accordance with claim 15 wherein said means for providing said second digital signal to the first input of said plurality of said first data register means where there are more data bits present in said second digital data signal than there are output lines from said first digital computer means and where there are a plurality of cards available each having a plurality of said first data register means comprises:

a first OR gate means having first and second input terminals and an output terminal;

a first inverter means having an input terminal and an output terminal;

means for connecting said first digital computer means to the first input terminal of said first OR gate means and for supplying a third digital signal, which is equal to logic 0 when said second digital data signal is available to be written out to said plurality of said first data register means, from said first digital computer means to the first input of said first OR gate means;

means for connecting said first digital computer means to the input terminal of said first inverter means and for supplying an address enable digital signal, which is equal to logic 1 when it is desired to enable the digital-to-analog conversion process for said second digital data signal, from said first digital computer means to the input of said first inverter means;

means for connecting the output terminal of said first inverter means to the second input terminal of said first OR gate means;

a first four bit to ten bit decoder means having first, second, third, and fourth input terminals and first through tenth output terminals;

means for supplying a first four bit digital address signal from said first digital computer means to the first, second, third, and fourth input terminals of said first four to ten bit decoder means;

a second OR gate means having first and second input terminals and an output terminal;

means for connecting the output terminal of said first OR gate means to the first input terminal of said second OR gate means;

means for connecting a selected one of the output terminals of said first four bit to ten bit decoder means to the second input terminal of said second OR gate means;

means for selecting one of said plurality of said cards by driving the output terminal of said second OR gate low in response to said first four bit digital address;

a second four bit to ten bit decoder means having first, second, third, and fourth input terminals and first through tenth output terminals;

means for supplying a second four bit digital address signal from said first digital computer means to the first, second, third, and fourth input terminals of said second four bit to ten bit decoder means;

a first AND gate means having first and second input terminals and an output terminal;

a second AND gate means having first and second input terminals and an output terminal;

a third AND gate means having first and second input terminals and an output terminal;

means for connecting the first and third output terminals of said second four bit to ten bit decoder means to the first and second inputs respectively of said first AND gate means;

means for connecting the fifth and seventh output terminals of said second four bit to ten bit decoder means to the first and second inputs respectively of said second AND gate means;

means for connecting the output terminal of said first AND gate means to the first input terminal of said third AND gate means and for connecting the output terminal of said second AND gate means to the second input terminal of said third AND gate means;

a third OR gate means having first and second input terminals and an output terminal;

means for connecting the output terminal of said second OR gate means to the first input terminal of said third OR gate means and for connecting the output terminal of said third AND gate means to the second input terminal of said third OR gate means;

fourth OR gate means having first and second input terminals and an output terminal;

means for establishing a clock signal;

second inverter means having an input terminal and an output terminal;

means for supplying said clock signal to the input terminal of said second inverter means;

means for connecting the output terminal of said second inverter means to the first input terminal of said fourth OR gate means and for connecting the output terminal of said third OR gate means to the second input terminal of said fourth OR gate means;

a second data register means having first and second input terminals and an output terminal;

means for supplying the most significant bits of said second digital signal to the first input of said second data register means;

means for connecting the output terminal of said fourth OR gate to the second input of said second data register means to provide a second enabling signal to said second data register means;

means for storing the most significant bits of said second digital signal in said second data register means until the least significant bits of said second digital signal have also been transmitted from said first digital computer means and then combining the most significant bits and the least significant bits of said second digital signal for transmission to the first input terminal of said plurality of said first data register means on the card selected.

19. Apparatus in accordance with claim 15 wherein said means for automatically selecting one of said plurality of said first data register means to be enabled and for providing a first enabling signal having a predetermined logic value from said first digital computer means to the second input of the selected one of said plurality of said first data register means comprises:

a first OR gate means having first and second input terminals and an output terminal;

a first inverter means having an input terminal and an output terminal;

means for connecting said first digital computer means to the first input terminal of said first OR gate means and for supplying a third digital signal, which is equal to logic 0 when said second digital data signal is available to be written out to said plurality of said first data register means, from said first digital computer means to the first input of said first OR gate means;

means for connecting said first digital computer means to the input terminal of said first inverter means and for supplying an address enable digital signal, which is equal to logic 1 when it is desired to enable the digital-to-analog conversion process for said second digital data signal, from said first digital computer means to the input of said first inverter means;

means for connecting the output terminal of said first inverter means to the second input terminal of said first OR gate;

a four bit to ten bit decoder means having first, second, third, and fourth input terminals and first through tenth output terminals;

means for supplying a four bit digital address signal from said first digital computer means to said first, second, third, and fourth input terminals of said four to ten bit decoder means;

a plurality of second OR gate means, equivalent to the number of said first data register means, each having first and second input terminals and an output terminal;

means for connecting the output terminal of said OR gate means to the first input terminal of said plurality of said second OR gate means;

means for connecting the second output terminal of said four bit to ten bit decoder to the second input terminal of a first one of said second OR gate means;

means for connecting the fourth output terminal of said four bit to ten bit decoder to the second input terminal of a second one of said second OR gate means;

means for connecting the sixth output terminal of said four bit to ten bit decoder to the second input terminal of a third one of said second OR gate means if a third one of said second OR gate means is utilized;

means for connecting the eighth output terminal of said four bit to ten bit decoder to the second input terminal of a fourth one of said second OR gate means if a fourth one of said second OR gate means is utilized;

means for connecting the ninth output terminal of said four bit to ten bit decoder to the second input terminal of a fifth one of said second OR gate means if a fifth one of said second OR gate means is utilized;

means for connecting the tenth output terminal of said four bit to ten bit decoder to the second input terminal of a sixth one of said second OR gate means if a sixth one of said second OR gate means is utilized;

a plurality of third OR gate means, equivalent to the number of said second OR gate means, each having first and second input terminals and an output terminal;

means for connecting the output terminal of said first one of said second OR gate means to the first input terminal of a first one of said third OR gate means;

means for connecting the output terminal of said second one of said second OR gate means to the first input terminal of a second one of said third OR gate means;

means for connecting the output terminal of said third one of said second OR gate means to the first input terminal of a third one of said third OR gate means if a third one of said second OR gate means is available;

means for connecting the output terminal of said fourth one of said second OR gate means to the first input terminal of a fourth one of said third OR gate means if a fourth one of said second OR gate means is available;

means for connecting the output terminal of said fifth one of said second OR gate means to the first input terminal of a fifth one of said third OR gate means if a fifth one of said second OR gate means is available;

means for connecting the output terminal of said sixth one of said second OR gate means to the first input terminal of a sixth one of said third OR gate means if a sixth one of said second OR gate means is available;

means for establishing a clock signal;

second inverter means having an input terminal and an output terminal;

means for supplying said clock signal to the input terminal of said second inverter means;

means for connecting the output terminal of said second inverter means to the second input terminal of said plurality of said third OR gate means;

means for connecting the output terminal of said first one of said third OR gate means to the second input terinal of a first one of said first data register means to enable said first one of said first data register means if the output terminal of said first one of said third OR gate means has a logic value of 0;

means for connecting the output terminal of said second one of said third OR gate means to the second input terminal of a second one of said first data register means to enable said second one of said first data register means if the output terminal of said second one of said third OR gate means has a logic value of 0;

means for connecting the output terminal of said third one of said third OR gate means to the second input terminal of a third one of said first data register means to enable said third one of said first data register means if the output terminal of said third one of said third OR gate means has a logic value of 0 if said third one of said first data register means is utilized;

means for connecting the output terminal of said fourth one of said third OR gate means to the second input terminal of a fourth one of said first data register means to enable said fourth one of said first data register means if the output terminal of said fourth one of said third OR gate means has a logic value of 0 if said fourth one of said first data register means is utilized;

means for connecting the output terminal of said fifth one of said third OR gate means to the second input terminal of a fifth one of said first data register means to enable said fifth one of said first data register means if the output terminal of said fifth one of said third OR gate means has a logic value of 0 if said fifth one of said first data register means is utilized; and means for connecting the output terminal of said sixth one of said third OR gate means to the second input terminal of a sixth one of said first data register means to enable said sixth one of said first data register means if the output terminal of said sixth one of said third OR gate means has a logic value of 0 if said sixth one of said first data register means is utilized.

20. Apparatus in accordance with claim 15 additionally comprising:

a plurality of optical isolator means, for transmitting said second digital signal to a second digital computer means, each of said plurality of said optical isolator means having an input terminal and an output terminal;

a plurality of voltage-to-current transducer means, each of said transducer means being for receiving a signal output by a respective one of said plurality of said digital-to-analog converter means and for supplying a signal having a desired current level, each of said plurality of said voltage-to-current transducer means having an input terminal and an output terminal;

means for connecting the input terminal of each one of said plurality of said optical isolator means to the output terminal of a respective one of said plurality of said first data register means;

means for connecting the output terminal of each of said plurality of said digital-to-analog converter means to a respective one of said plurality of said voltage-to-current transducer means; and means to initiate the transmission of said second digital signal via one of said plurality of said optical isolator means.

21. Apparatus comprising:

a digital computer means for producing a first digital signal and for producing control signals to route said first digital signal to a desired destination;

a plurality of digital-to-analog converter means, for receiving and converting a digital signal to an analog signal and for supplying said analog signal to a desired destination, each of said plurality of said digital-to-analog converter means having an input terminal and an output terminal;

a plurality of first data register means, for receiving said first digital signal from said first digital computer means and supplying said first digital signal to at least a respective one of said plurality of said digital-to-analog converter means, each of said plurality of said first data register means having first and second input terminals and an output terminal;

means for connecting the input terminal of each one of said plurality of said digital-to-analog converter means to the output terminal of a respective one of said plurality of said first data register means;

a first OR gate means having first and second input terminals and an output terminal;

a first inverter means having an input terminal and an output terminal;

means for connecting said first digital computer means to the first input terminal of said first OR gate means and for supplying a second digital signal, which is equal to logic 0 when said first digital signal is available to be written out to said plurality of said first data register means, from said first digital computer means to the first input of said first OR gate means;

means for connecting said first digital computer means to the input terminal of said first inverter means and for supplying an address enable digital signal, which is equal to logic 1 when it is desired to enable the digital-to-analog conversion process for said first digital data signal, from said first digital computer means to the input of said first inverter means;

means for connecting the output terminal of said first inverter means to the second input terminal of said first OR gate means;

a four bit to ten bit decoder means having first, second, third, and fourth input terminals and first through tenth output terminals;

means for supplying a four bit digital address signal from said first digital computer means to said first, second, third, and fourth input terminals of said four to ten bit decoder means;

a first AND gate means having first and second input terminals and an output terminal;

a second AND gate means having first and second input terminals and an output terminal;

a third AND gate means having first and second input terminals and an output terminal;

means for connecting the first and third output terminals of said four bit to ten bit decoder means to the first and second inputs respectively of said first AND gate means;

means for connecting the fifth and seventh output terminals of said four bit to ten bit decoder means to the first and second inputs respectively of said second AND gate means;

means for connecting the output terminal of said first AND gate means to the first input terminal of said third AND gate means and for connecting the output terminal of said second AND gate means to the second input terminal of said third AND gate means;

second OR gate means having first and second input terminals and an output terminal;

means for connecting the output terminal of said first OR gate means to the first input terminal of said second OR gate means and for connecting the output terminal of said third AND gate means to the second input terminal of said second OR gate means;

third OR gate means having first and second input terminals and an output terminal;

means for establishing a clock signal;

second inverter means having an input terminal and an output terminal;

means for supplying said clock signal to the input terminal of said second inverter means;

means for connecting the output terminal of said second inverter means to the first input terminal of said third OR gate means and for connecting the output terminal of said second OR gate means to the second input terminal of said third OR gate means;

a second data register means having first and second input terminals and an output terminal;

means for supplying the most significant bits of said first digital signal to the first input of said second data register means;

means for connecting the output terminal of said third OR gate means to the second input of said second data register means to provide a second enabling signal to said second data register means;

means for storing the most significant bits of said first digital signal in said second data register means until the least significant bits of said first digital signal have also been transmitted from said first digital computer means and then transmitting the combination of the most significant bits and the least significant bits of said first digital signal to the first input terminal of said plurality of said first data register means; and means for automatically selecting one of said plurality of said first data register means to be enabled and for providing a first enabling signal having a predetermined logic value from said first digital computer means to the second input of the selected one of said plurality of said first data register means to enable the selected one of said plurality of said first data register means and initiate the digital-to-analog conversion of said first digital signal.

22. Apparatus comprising:

a digital computer means for producing a first digital signal and for producing control signals to route said first digital signal to a desired destination;

a plurality of digital-to-analog converter means, for receiving and converting a digital signal to an analog signal and for supplying said analog signal to a desired destination, each of said plurality of said digital-to-analog converter means having an input terminal and an output terminal;

a plurality of first data register means, for receiving said first digital signal from said first digital computer means and supplying said first digital signal to at least a respective one of said plurality of said digital-to-analog coverter means, each of said plurality of said first data register means having first and second input terminals and an output terminal;

means for connecting the input terminal of each one of said plurality of said digital-to-analog coverter means to the output terminal of a respective one of said plurality of said first data register means;

a first OR gate means having first and second input terminals and an output terminal;

a first inverter means having an input terminal and an output terminal;

means for connecting said first digital computer means to the first input terminal of said first OR gate means and for supplying a second digital signal, which is equal to logic 0 when said first digital data signal is available to be written out to said plurality of said first data register means, from said first digital computer means to the first input of said first OR gate means;

means for connecting said first digital computer means to the input terminal of said first inverter means and for supplying an address enable digital signal, which is equal to logic 1 when it is desired to enable the digital to analog conversion process for said first digital data signal, from said first digital computer means to the input of said first inverter means;

means for connecting the output terminal of said first inverter means to the second input terminal of said first OR gate means;

a first four bit to ten bit decoder means having first, second, third, and fourth input terminals and first through tenth output terminals;

means for supplying a first four bit digital address signal from said first digital computer means to the first, second, third, and fourth input terminals of said first four to ten bit decoder means;

a second OR gate means having first and second input terminals and an output terminal;

means for connecting the output terminal of said first OR gate means to the first input terminal of said second OR gate means;

means for connecting a selected one of the output terminals of said first four bit to ten bit decoder means to the second input terminal of said second OR gate means;

means for selecting one of a plurality of said cards, each having a plurality of said first data register means, by driving the output terminal of said second OR gate low in response to said first four bit digital address;

a second four bit to ten bit decoder means having first, second, third, and fourth input terminals and first through tenth output terminals;

means for supplying a second four bit digital address signal from said first digital computer means to the first, second, third, and fourth input terminals of said second to ten bit decoder means;

a first AND gate means having first and second input terminals and an output terminal;

a second AND gate means having first and second input terminals and an output terminal;

a third AND gate means having first and second input terminals and an output terminal;

means for connecting the first and third output terminal of said second four bit to ten bit decoder means to the first and second inputs respectively of said first AND gate means;

means for connecting the fifth and seventh output terminals of said second four bit to ten bit decoder means to the first and second inputs respectively of said second AND gate means;

means for connecting the output terminal of said first AND gate means to the first input terminal of said third AND gate means and for connecting the output terminal of said second AND gate means to the second input terminal of said third AND gate means;

a third OR gate means having first and second input terminals and an output terminal;

means for connecting the output terminal of said second OR gate means to the first input terminal of said third OR gate means and for connecting the output terminal of said third AND gate means to the second input terminal of said third OR gate means;

fourth OR gate means having first and second input terminals and an output terminal;

means for establishing a clock signal;

second inverter means having an input terminal and an output terminal;

means for supplying said clock signal to the input terminal of said second inverter means;

means for connecting the output terminal of said second inverter means to the first input terminal of said fourth OR gate means and for connecting the output terminal of said third OR gate means to the second input terminal of said fourth OR gate means;

a second data register means having first and second input terminals and an output terminal;

means for supplying the most significant bits of said first digital signal to the first input of said second data register means;

means for connecting the output terminal of said fourth OR gate to the second input of said second data register means to provide a second enabling signal to said second data register means;

means for storing the most significant bits of said first digital signal in said second data register means until the least significant bits of said first digital signal have also been transmitted from said first digital computer means and then transmitting the combination of the most significant bits and the least significant bits of said first digital signal for transmission to the first input terminal of said plurality of said first data register means on the card selected; and means for automatically selecting one of said plurality of said first data register means to be enabled and for providing a first enabling signal having a predetermined logic value from said first digital computer means to the second input of the selected one of said plurality of said first data register means to enable the selected one of said plurality of said first data register means and initiate the digital-to-analog conversion of said first digital signal.

23. Apparatus comprising:

a digital computer means for producing a first digital signal and for producing control signals to route said first digital signal to a desired destination;

a plurality of digital-to-analog converter means, for receiving and converting a digital signal to an analog signal and for supplying said analog signal to a desired destination, each of said plurality of said digital-to-analog converter means having an input terminal and an output terminal;

a plurality of first data register means, for receiving said first digital signal from said first digital computer means and supplying said first digital signal to at least a respective one of said plurality of said digital-to-analog converter means, each of said plurality of said first data register means having first and second input terminals and an output terminal;

means for connecting the input terminal of each one of said plurality of said digital-to-analog converter means to the output terminal of a respective one of said plurality of said first data register means;

means for providing said first digital signal to the first input of said plurality of said first data register means;

a first OR gate means having first and second input terminals and an output terminal;

a first inverter means having an input terminal and an output terminal;

means for connecting said first digital computer means to the first input terminal of said first OR gate means and for supplying a second digital signal, which is equal to logic 0 when said first digital data signal is available to be written out to said plurality of said first data register means, from said first digital computer means to the first input of said first OR gate means;

means for connecting said first digital computer means to the input terminal of said first inverter means and for supplying an address enable digital signal, which is equal to logic 1 when it is desired to enable the digital to analog conversion process for said first digital data signal, from said first digital computer means to the input of said first inverter means;

means for connecting the output terminal of said first inverter means to the second input terminal of said first OR gate;

a four bit to ten bit decoder means having first, second, third, and fourth input terminals and first through tenth output terminals;

means for supplying a four bit digital address signal from said first digital computer means to said first, second, third, and fourth input terminals of said four to ten bit decoder means;

a plurality of second OR gate means, equivalent to the number of said first data register means, each having first and second input terminals and an output terminal;

means for connecting the output terminal of said first OR gate means to the first input terminal of said plurality of said second OR gate means;

means for connecting the second output terminal of said four bit to ten bit decoder to the second input terminal of a first one of said second OR gate means;

means for connecting the fourth output terminal of said four bit to ten bit decoder to the second input terminal of a second one of said second OR gate means;

means for connecting the sixth output terminal of said four bit to ten bit decoder to the second input terminal of a third one of said second OR gate means if a third one of said second OR gate means is utilized;

means for connecting the eighth output terminal of said four bit to ten bit decoder to the second input terminal of a fourth one of said second OR gate means if a fourth one of said second OR gate means is utilized;

means for connecting the ninth output terminal of said four bit to ten bit decoder to the second input terminal of a fifth one of said second OR gate means if a fifth one of said second OR gate means is utilized;

means for connecting the tenth output terminal of said four bit to ten bit decoder to the second input terminal of a sixth one of said second OR gate means if a sixth one of said second OR gate means is utilized;

a plurality of third OR gate means, equivalent to the number of said second OR gate means, each having first and second input terminals and an output terminal;

means for connecting the output terminal of said first one of said second OR gate means to the first input terminal of a first one of said third OR gate means;

means for connecting the output terminal of said second one of said second OR gate means to the first input terminal of a second one of said third OR gate means;

means for connecting the output terminal of said third one of said second OR gate means to the first input terminal of a third one of said third OR gate means if a third one of said second OR gate means is available;

means for connecting the output terminal of said fourth one of said second OR gate means to the first input terminal of a fourth one of said third OR gate means if a fourth one of said second OR gate means is available;

means for connecting the output terminal of said fifth one of said second OR gate means to the first input terminal of a fifth one of said third OR gate means if a fifth one of said second OR gate means is available;

means for connecting the output terminal of said sixth one of said second OR gate means to the first input terminal of a sixth one of said third OR gate means if a sixth one of said second OR gate means is available;

means for establishing a clock signal;

second inverter means having an input terminal and an output terminal;

means for supplying said clock signal to the input terminal of said second inverter means;

means for connecting the output terminal of said second inverter means to the second input terminal of said plurality of said third OR gate means;

means for connecting the output terminal of said first one of said third OR gate means to the second input terminal of a first one of said first data register means to enable said first one of said first data register means if the output terminal of said first one of said third OR gate means has a logic value of 0;

means for connecting the output terminal of said second one of said third OR gate means to the second input terminal of a second one of said first data register means to enable said second one of said first data register means if the output terminal of said second one of said third OR gate means has a logic value of 0;

means for connecting the output terminal of said third one of said third OR gate means to the second input terminal of a third one of said first data register means to enable said third one of said first data register means if the output terminal of said third one of said third OR gate means has a logic value of 0 if said third one of said first data register means is utilized;

means for connecting the output terminal of said fourth one of said third OR gate means to the second input terminal of a fourth one of said first data register means to enable said fourth one of said first data register means if the output terminal of said fourth one of said third OR gate means has a logic value of 0 if said fourth one of said first data register means is utilized;

means for connecting the output terminal of said fifth one of said third OR gate means to the second input terminal of a fifth one of said first data register means to enable said fifth one of said first data register means if the output terminal of said fifth one of said third OR gate means has a logic value of 0 if said fifth one of said first data register means is utilized; and means for connecting the output terminal of said sixth one of said third OR gate means to the second input terminal of a sixth one of said first data register means to enable said sixth one of said first data register means if the output terminal of said sixth one of said third OR gate means has a logic value of 0 if said sixth one of said first data register means is utilized.

24. Apparatus comprising:

a digital computer means for producing a first digital signal and for producing control signals to route said first digital signal to a desired destination;

a plurality of digital-to-analog converter means, for receiving and converting a digital signal to an analog signal and for supplying said analog signal to a desired destination, each of said plurality of said digital-to-analog converter means having an input terminal and an output terminal;

a plurality of first data register means, for receiving said first digital signal from said first digital computer means and supplying said first digital signal to at least a respective one of said plurality of said digital-to-analog converter means, each of said plurality of said first data register means having first and second input terminals and an output terminal;

means for connecting the input terminal of each one of said plurality of said digital-to-analog converter means to the output terminal of a respective one of said plurality of said first data register means;

means for providing said first digital signal to the first input of said plurality of said first data register means; and means for automatically selecting one of said plurality of said first data register means to be enabled and for providing a first enabling signal having a predetermined logic value from said first digital computer means to the second input of the selected one of said plurality of said first data register means to enable the selected one of said plurality of said first data register means and initiate the digital-to-analog conversion of said first digital signal;

a plurality of optical isolator means, for transmitting said first digital signal to a second digital computer means, each of said plurality of said optical isolator means having an input terminal and an output terminal;

a plurality of voltage-to-current transducer means, each of said transducer means being for receiving a signal output by a respective one of said plurality of said digital-to-analog converter means and for supplying a signal having a desired current level, each of said plurality of said voltage-to-current transducers means having an input terminal and an output terminal;

means for connecting the input terminal of each one of said plurality of said optical isolator means to the output terminal of a respective one of said plurality of said first data register means;

means for connecting the output terminal of each of said plurality of said digital-to-analog converter means to a respective one of said plurality of said voltage-to-current transducer means; and means to initiate the transmission of said first digital signal via one of said plurality of said optical isolator means.

25. A method for converting an analog signal into a digital signal comprising the steps of:

establishing a first analog signal;

establishing an offset voltage signal;

combining said first analog signal and said offset voltage signal to produce a second analog signal;

amplifying said second analog signal to thereby establish an amplified second analog signal having a first predetermined relationship to said second analog signal;

establishing a third analog signal representative of the highest voltage level which is desirable for analog-to-digital conversion;

comparing said amplified second analog signal to said third analog signal and converting said amplified second analog signal into a first digital signal if the voltage level of said amplified second analog signal does not exceed the voltage level of said third analog signal; and converting said second analog signal into a first digital signal if the voltage level of said amplified second analog signal exceeds the voltage level of said third analog signal, said offset voltage signal having a voltage level which will reduce the voltage level of said first analog signal to enable said amplified second analog signal to be converted into said first digital signal if the difference between the voltage level of said first analog signal multiplied by the voltage level of said amplified second analog signal divided by the voltage level of said second analog signal, (amplified second/second) and the voltage level of said third analog signal does not exceed the maximum available absolute voltage level of said offset voltage signal multiplied by the voltage level of said amplified second analog signal divided by the voltage level of said second analog signal.

26. A method in accordance with claim 25 wherein said steps of comparing said amplified second analog signal to said third analog signal and converting said amplified second analog signal to a digital signal comprises;
  supplying said amplified second analog signal to a first switching means which is connected to an analog-to-digital converter means and also supplying said amplified second analog signal to the first input terminal of a comparator means;
  supplying said third analog signal to a second input terminal of said comparator means;
  establishing a fourth analog signal having a constant current level which will flow into the output terminal of said comparator means if said third analog signal has a voltage level greater than or equal to the voltage level of said amplified second analog signal or which will flow into the first input terminal of a flip-flop means if said sixth analog signal has a voltage level less than the voltage level of said amplified second analog signal;
  establishing a clock signal;
  connecting the second input terminal of said flip-flop means to said clock signal; and
  closing said first switching means in response to the output signal from the first output terminal of said flip-flop means if the output signal of the first output terminal of said flip-flop means has a predetermined logic value.

27. A method in accordance with claim 26 wherein said step of converting said second analog signal into a digital signal comprises:
  supplying said second analog signal to a second switching means which is connected to an analog-to-digital converter means; and
  closing said second switching means in response to the output signal from the second output terminal of said flip-flop means if the output signal of the second output terminal of said flip-flop means has a predetermined logic value and in this way assuring that said second signal and said amplified second signal can never be connected to said analog-to-digital converter means at the same time.

28. A method in accordance with claim 25 wherein said step of establishing said offset voltage signal comprises automatically controlling the amount of current flowing through a resistor means of known value to produce said offset voltage signal representative of the voltage level across said resistor means.

29. A method in accordance with claim 25 wherein said step of establishing said offset voltage signal comprises:
  establishing a digital command signal representative of the required voltage level of said offset voltage signal;
  establishing a sixth analog signal representative of a constant current reference;
  establishing a seventh analog signal representative of a constant current source;
  providing said digital command signal and said sixth analog signal to a digital-to-analog converter means;
  providing said seventh analog signal to said digital-to-analog converter means and to a resistor means;
  establishing the current flow from said seventh analog signal which must be supplied to said digital-to-analog converter means in response to said digital command signal and said seventh analog signal and thus establishing said offset voltage signal which is representative of the voltage level across said resistor means which is determined by the current from said seventh analog signal which flows across said resistor means; and
  supplying additional current to said digital-to-analog converter means if the current flow from said seventh analog signal which must be supplied to said digital-to-analog converter means exceeds the current available from said seventh analog signal thus allowing said offset voltage signal to have a positive or negative voltage level whichever may be desired.

30. A method in accordance with claim 29 wherein said method for establishing the current flow from said seventh analog signal which must be supplied to said digital-to-analog converter means comprises:
  determining the binary number contained in said digital command signal;
  dividing said binary number by a constant to establish a ratio; and
  multiplying said ratio by said sixth analog signal to establish the current flow from said seventh analog signal which must be supplied to said digital-to-analog converter means.

31. A method in accordance with claim 25 wherein said step of establishing said second analog signal in response to said first analog signal and said offset voltage signal comprises summing said first analog signal and said offset voltage signal.

32. A method in accordance with claim 25 comprising the additional steps of:
  establishing a fourth analog signal having a second predetermined relationship to said second analog signal, said fourth analog signal having a higher voltage level than said amplified second analog signal; and
  comparing said fourth analog signal to said third analog signal and converting said fourth analog signal into a digital signal if the voltage level of said fourth analog signal does not exceed the voltage level of said third analog signal, said offset voltage signal having a voltage level which will reduce the voltage level of said first analog signal to enable said fourth analog signal to be converted into said first digital signal if the difference between the voltage level of said first analog signal multiplied by the voltage level of said fourth analog signal divided by the voltage level of said second analog signal, (first)(fourth/second), and the voltage level of said third analog signal does not exceed the maximum available absolute voltage level of said offset voltage signal multiplied by the voltage level of said fourth analog signal divided by the voltage level of said second analog signal, (offset)(fourth/second).

33. A method in accordance with claim 32 wherein said step of comparing said fourth analog signal to said third analog signal and converting said fourth analog signal into a digital signal comprises:

supplying said fourth analog signal to a first switching means which is connected to an analog-to-digital converter means and also supplying said fourth analog signal to the first input terminal of a first comparator means;

supplying said third analog signal to a second input terminal of said first comparator means;

establishing a fifth analog signal having a constant current level which will flow into the output terminal of said first comparator means if said third analog signal has a voltage level greater than or equal to the voltage level of said fourth analog signal or which will flow into the first input terminal of a first flip-flop means if said third analog signal has a voltage level less than the voltage level of said fourth analog signal;

establishing a clock signal;

connecting the second input terminal of said first flip-flop means to said clock signal; and closing said first switching means in response to the output signal from the first output terminal of said first flip-flop means if the output signal of the first output terminal of said first flip-flop means has a predetermined logic value.

34. A method in accordance with claim 33 wherein said step of comparing said amplified second analog signal to said third analog signal and converting said amplified second analog signal into a digital signal comprises:

supplying said amplified second analog signal to a second switching means which is connected to said analog-to-digital converter means and also supplying said second analog signal to the first input of a second comparator means;

supplying said third analog signal to the second input terminal of said second comparator means;

establishing a sixth analog signal having a constant current level which will flow into the output terminal of said second comparator means if said third analog signal has a voltage level greater than or equal to the voltage level of said amplified second analog signal or which will flow into the first input terminal of said second flip-flop means if said third analog signal has a voltage level less than the voltage level of said amplified second analog signal;

connecting the second input terminal of said second flip-flop means to said clock signal;

connecting the second output terminal of said first flip-flop means to the first input terminal of an operate low AND gate means;

connecting the first output terminal of said second flip-flop means to the second input terminal of said operate low AND gate means; and closing said second switching means in response to the output signal from the output terminal of said operate low AND gate means if the output signal of the output terminal of said operate low AND gate means has a predetermined logic value and in this way assuring that said fourth analog signal and said amplified second analog signal can never be connected to said analog to digital converter means at the same time.

35. A method in accordance with claim 34 wherein said step of converting said second analog signal into a digital signal comprises:

supplying said second analog signal to a third switching means which is connected to said analog-to-digital converter means; and closing said third switching means in response to the output signal from the second output terminal of said second flip-flop means if the output signal of the second output terminal of said second flip-flop means has a predetermined logic value and in this way assuring that said second signal, said amplified second signal, or said fourth signal can never be connected to said analog-to-digital converter means at the same time.

36. A method in accordance with claim 25 additionally comprising the steps of:

removing noise from said second analog signal;

removing noise from said amplified second analog signal;

sampling said second analog signal or said amplified second analog signal, and holding the sampled data from said second analog signal or said amplified second analog signal until the analog-to-digital conversion is initiated;

delaying the holding of said sampled data from said second analog signal or said amplified second analog signal until said sampled data has settled; and initiating the analog-to-digital conversion when the analog data to be converted is received.

37. A method in accordance with claim 32 additionally comprising:

removing noise from said second analog signal;

removing noise from said amplified second analog signal;

sampling said second analog signal, said amplified second analog signal, or said fourth analog signal and holding the sampled data from said second analog signal, said amplified second analog signal, or said fourth analog signal until the analog-to-digital conversion is initiated;

delaying the holding of said sampled data from said second analog signal, said amplified second analog signal, or said fourth analog signal until said sampled data has settled; and initiating the analog-to-digital conversion when the analog data to be converted is received.

38. A method in accordance with claim 25 comprising the additional steps of:

processing said first digital signal and outputting a second digital signal in response to said first digital signal;

establishing control signals to route said second digital signal to a desired destination;

utilizing the logic sequence of said control signals to provide said second digital signal to the first input of a plurality of first data register means; and utilizing the logic sequence of said control signals to automatically select one of said plurality of said first data register means to be enabled and to provide a first enabling signal having a predetermined logic value to the second input of the selected one of said plurality of said first data register means to enable the selected one of said plurality of said first data register means and initiate the digital-to-analog conversion of said second digital signal.

39. A method in accordance with claim 38 wherein said step of utilizing the logic sequence of said control signals to provide said second digital signal to the first input terminal of said plurality of said first data register means comprises buffering said second digital signal and supplying said buffered second digital signal to the first input terminal of said plurality of said first data register means.

40. A method in accordance with claim 38 wherein said step of utilizing the logic sequence of said control signals to provide said second digital signal to the first input terminal of said plurality of said first data register means where there are more data bits present in said second digital signal than there are output lines from a digital computer means utilized to generate said second digital signal and said control signals comprises:

establishing a third digital signal which is equal to logic 0 when said second digital signal is available to be written out to said plurality of said first data register means;

establishing an address enable digital signal which is equal to logic 1 when it is desired to enable the digital-to-analog conversion process for said second digital signal;

inverting said address enable digital signal;

establishing a fourth digital signal which has a logic value of 0 when said third digital signal has a logic value of 0 and said inverted address enable digital signal has a logic value of 0;

decoding a four bit digital address signal from said digital computer means and supplying first through tenth output signals, each of said first through tenth output signals having a logic value which is determined by the binary value of said four bit digital address signal;

establishing a fifth digital signal having a logic value of 0 when said first or said third output signals has a logic value of 0;

establishing a sixth digital signal having a logic value of 0 when said fifth or said seventh output signals has a logic value of 0;

establishing a seventh digital signal having a logic value of 0 when said fifth digital signal or said sixth digital signal has a logic value of 0;

establishing an eighth digital signal having a logic value of 0 when said fourth digital signal and said seventh digital signal have a logic value of 0;

establishing a clock signal;

inverting said clock signal;

establishing a ninth digital signal having a logic value of 0 when said eighth digital signal has a logic value of 0 and said inverted clock signal has a logic value of 0;

utilizing said ninth digital signal to enable a second data register means; and transmitting the most significant bits of said second digital signal from said digital computer means and storing the most significant bits of said second digital signal in said second data register means until the least significant bits of said second digital signal have also been transmitted from digital computer means and then combining the most significant bits and the least significant bits of said second digital signal for transmission to the first input terminal of said plurality of said first data register means.

41. A method in accordance with claim 38 wherein said step of utilizing the logic sequence of said control signals to provide said second digital signal to the first input of said plurality of said first data register means where there are more data bits present in said second digital data signal than there are output lines from a digital computer means utilized to generate said second digital signal and said control signals and where there are a plurality of cards available each having a plurality of said first data register means comprises:

establishing a third digital signal which is equal to logic 0 when said second digital signal is available to be written out to said plurality of said first data register means;

establishing an address enable digital signal which is equal to logic 1 when it is desired to enable the digital-to-analog conversion process for said second digital signal;

inverting said address enable digital signal;

establishing a fourth digital signal which has a logic value of 0 when said third digital signal has a logic value of 0 and said inverted address enable digital signal has a logic value of 0;

decoding a first four bit digital address signal from said digital computer means and supplying first through tenth output signals each of said first through tenth output signals having a logic value which is determined by the binary value of said first four bit digital address signal;

establishing a fifth digital signal having a logic value of 0 when said fourth digital signal has a logic value of 0 and the one of said first through tenth output signals tied to a first one of said cards has a logic value of 0 signifying that said first one of said cards has been selected;

decoding a second four bit digital address signal from said digital computer means and supplying eleventh through twentieth output signals each of said eleventh through twentieth output signals having a logic value which is determined by the binary value of said second four bit digital address signal;

establishing a sixth digital signal having a logic value of 0 when said eleventh or said thirteenth output signals has a logic value of 0;

establishing a seventh digital signal having a logic value of 0 when said fifteenth or said seventeenth output signals has a logic value of 0;

establishing an eighth digital signal having a logic value of 0 when said sixth digital signal or said seventh digital signal has a logic value of 0;

establishing a ninth digital signal having a logic value of 0 when said fifth digital signal and said eighth digital signal have a logic value of 0;

establishing a clock signal;

inverting said clock signal;

establishing a tenth digital signal having a logic value of 0 when said ninth digital signal has a logic value of 0 and when said inverted clock signal has a logic value of 0;

utilizing said tenth digital signal to enable a second data register means;

transmitting the most significant bits of said second digital signal from said digital computer means and storing the most significant bits of said second digital signal in said second data register means until the least significant bits of said digital signal have also been transmitted from said digital computer means and then combining the most significant bits and the least significant bits of said second digital signal for transmission to the first input terminal of said plurality of said first data register means on said first one of said cards selected.

42. A method in accordance with claim 38 wherein said step of utilizing the logic sequence of said control signals to automatically select one of said plurality of said first data register means to be enabled and for providing a first enabling signal having a predetermined logic value to the second input of the selected one of said plurality of said first data register means where a digital computer means is utilized to generate said second digital signal and said control signals comprises:

establishing a third digital signal which is equal to logic 0 when said second digital signal is available to be written out to said plurality of said first data register means;

establishing an address enable digital signal which is equal to logic 1 when it is desired to enable the digital-to-analog conversion process for said second digital signal;

inverting said address enable digital signal;

establishing a fourth digital signal which has a logic value of 0 when said third digital signal has a logic value of 0 and said inverted address enable digital signal has a logic value of 0;

decoding a four bit digital address signal from said first digital computer means and supplying first through tenth output signals each of said first through tenth output signals having a logic value which is determined by the binary value of said four bit digital address signal;

supplying said third digital signal to the first input terminal of a plurality of first OR gate means;

supplying said second output signal to the second input terminal of a first one of said first OR gate means;

supplying said fourth output signal to the second output terminal of a second one of said first OR gate means;

supplying said sixth output signal to the second input terminal of a third one of said first OR gate means if a third one of said first OR gate means is utilized;

supplying said eighth output signal to the second input terminal of a fourth one of said first OR gate means if a fourth one of said first OR gate means is utilized;

supplying said ninth output signal to the second input terminal of a fifth one of said first OR gate means if a fifth one of said first OR gate means is utilized;

supplying said tenth output signal to the second input terminal of a sixth one of said first OR gate means if a sixth one of said first OR gate means is utilized;

connecting the output terminal of each one of said plurality of said first OR gate means to the first input terminal of a respective one of a plurality of second OR gate means;

establishing a clock signal;

inverting said clock signal;

supplying said inverted clock signal to the second input terminal of said plurality of said second OR gate means;

connecting the output terminal of a first one of said second OR gate means to the second input terminal of a first one of said first data register means to enable said first one of said first data register means if the output terminal of said first one of said second OR gate means has a logic value of 0;

connecting the output terminal of a second one of said second OR gate means to the second input terminal of a second one of said first data register means to enable said second one of said first data register means if the output terminal of said second one of said second OR gate means has a logic value of 0;

connecting the output terminal of a third one of said second OR gate means to the second input terminal of a third one of said first data register means to enable said third one of said first data register means if the output terminal of said third one of said second OR gate means has a logic value of 0, if said third one of said first data register means is utilized;

connecting the output terminal of a fourth one of said second OR gate means to the second input terminal of a fourth one of said first data register means to enable said fourth one of said first data register means if the output terminal of said fourth one of said second OR gate means has a logic value of 0, if said fourth one of said first data register means is utilized;

connecting the output terminal of a fifth one of said second OR gate means to the second input terminal of a fifth one of said first data register means to enable said fifth one of said first data register means if the output terminal of said fifth one of said second OR gate means has a logic value of 0, if said fifth one of said first data register means is utilized; and connecting the output terminal of a sixth one of said second OR gate means to the second input terminal of a sixth one of said first data register means to enable said sixth one of said first data register means if the output terminal of said sixth one of said second OR gate means has a logic value of 0, if said sixth one of said first data register means is utilized.

43. A method in accordance with claim 38 additionally comprising the steps of:

utilizing the logic sequence of said control signals to initiate transmission of said second digital signal via one of a plurality of optical isolator means; and converting the analog signal established in the digital-to-analog conversion of said second digital signal from a voltage to a current.

44. A method for converting a digital signal to an analog signal comprising the steps of:

establishing a first digital signal;

establishing control signals to route said first digital signal to a desired destination;

establishing second digital signal which is equal to logic 0 when said first digital signal is available to be written out to a plurality of first data register means;

establishing an address enable digital signal which is equal to logic 1 when it is desired to enable the digital-to-analog conversion process for said first digital signal;

inverting said address enable digital signal;

establishing a third digital signal which has a logic value of 0 when said second digital signal has a logic value of 0 and said inverted address enable digital signal has a logic value of 0;

decoding a four bit digital address signal from said digital computer means and supplying first through tenth output signals, each of said first through tenth output signals having a logic value which is determined by the binary value of said four bit digital address signal;

establishing a fourth digital signal having a logic value of 0 when said first or said third output signals has a logic value of 0;

establishing a fifth digital signal having a logic value of 0 when said fifth or said seventh output signals has a logic value of 0;

establishing a sixth digital signal having a logic value of 0 when said fourth digital signal or said fifth digital signal has a logic value of 0;

establishing a seventh digital signal having a logic value of 0 when said third digital signal and said sixth digital signal have a logic value of 0;

establishing a clock signal;

inverting said clock signal;

establishing an eighth digital signal having a logic value of 0 when said seventh digital signal has a logic value of 0 and said inverted clock signal has a logic value of 0;

utilizing said eighth digital signal to enable a second data register means;

transmitting the most significant bits of said first digital signal from said digital computer means and storing the most significant bits of said first digital signal in said second data register means until the least significant bits of said first digital signal have also been transmitted from said digital computer means and then transmitting the combination of the most significant bits and the least significant bits of said first digital signal to the first input terminal of said plurality of said first data register means; and utilizing the logic sequence of said control signals to automatically select one of said plurality of said first data register means to be enabled and to provide a first enabling signal having a predetermined logic value to the second input of the selected one of said plurality of said first data register means to enable the selected one of said plurality of said first data register means and initiate the digital-to-analog conversion of said first digital signal.

45. A method for converting a digital signal to an analog signal comprising the steps of:

establishing a first digital signal;

establishing control signals to route said first digital signal to a desired destination;

establishing a second digital signal which is equal to logic 0 when said first digital signal is available to be written out to a plurality of first data register means;

establishing an address enable digital signal which is equal to logic 1 when it is desired to enable the digital-to-analog conversion process for said first digital signal;

inverting said address enable digital signal;

establishing a third digital signal which has a logic value of 0 when said second digital signal has a logic value of 0 and said inverted address enable digital signal has a logic value of 0;

decoding a first four bit digital address signal from said digital computer means and supplying first through tenth output signals, each of said first through tenth output signals having a logic value which is determined by the binary value of said first four bit digital address signal;

establishing a fourth digital signal having a logic value of 0 when said third digital signal has a logic value of 0 and the one of said first through tenth output signals tied to a first one of a plurality of cards, each card having a plurality of said first data register means, has a logic value of 0 signifying that said first one of said plurality of cards has been selected;

decoding a second four bit digital address signal from said digital computer means and supplying eleventh through twentieth output signals each of said eleventh through twentieth output signals having a logic value which is determined by the binary value of said second four bit digital address signal;

establishing a fifth digital signal having a logic value of 0 when said eleventh or said thirteenth output signals has a logic value of 0;

establishing a sixth digital signal having a logic value of 0 when said fifteenth or said seventeenth output signals has a logic value of 0;

establishing a seventh digital signal having a logic value of 0 when said fifth digital signal or said sixth digital signal has a logic value of 0;

establishing an eighth digital signal having a logic value of 0 when said fourth digital signal and said seventh digital signal have a logic value of 0;

establishing a clock signal;

inverting said clock signal;

establishing a ninth digital signal having a logic value of 0 when said eighth digital signal has a logic value of 0 and when said inverted clock signal has a logic value of 0;

utilizing said ninth digital signal to enable a second data register means;

transmitting the most significant bits of said first digital signal from said digital computer means and storing the most significant bits of said first digital signal in said second data register means until the least significant bits of said first digital signal have also been transmitted from said digital computer means and then transmitting the combination of the most significant bits and the least significant bits of said first digital signal to the first input terminal of said plurality of said first data register means on said first one of said cards selected;

utilizing the logic sequence of said control signals to automatically select one of said plurality of said first data register means to be enabled and to provide a first enabling signal having a predetermined logic value to the second input of the selected one of said plurality of said first data register means to enable the selected one of said plurality of said first data register means and initiate the digital-to-analog conversion of said first digital signal.

46. A method for converting a digital signal to an analog signal comprising the steps of:

establishing a first digital signal;

establishing control signals to route said first digital signal to a desired destingation;

utilizing the logic sequence of said control signals to provide said first digital signal to the first input of a plurality of first data register means; and establishing a second digital signal which is equal to logic 0 when said first digital signal is available to be written out to said plurality of said first data register means;

establishing an address enable digital signal which is equal to logic 1 when it is desired to enable the digital-to-analog conversion process for said first digital data signal;

inverting said address enable digital signal;

establishing a third digital signal which has a logic value of 0 when said second digital signal has a logic value of 0 and said inverted address enable digital signal has a logic value of 0;

decoding a four bit digital address signal from said first digital computer means and supplying first through tenth output signals each of said first through tenth output signals having a logic value which is determined by the binary value of said four bit digital address signal;

supplying said third digital signal to the first input terminal of a plurality of first OR gate means;

supplying said second output signal to the second input terminal of a first one of said first OR gate means;

supplying said fourth output signal to the second output terminal of a second one of said first OR gate means;

supplying said sixth output signal to the second input terminal of a third one of said first OR gate means if a third one of said first OR gate means is utilized;

supplying said eighth output signal to the second input terminal of a fourth one of said first OR gate means if a fourth one of said first OR gate means is utilized;

supplying said ninth output signal to the second input terminal of a fifth one of said first OR gate means if a fifth one of said first OR gate means is utilized;

supplying said tenth output signal to the second input terminal of a sixth one of said first OR gate means if a sixth one of said first OR gate means is utilized;

connecting the output terminal of each one of said plurality of said first OR gate means to the first input terminal of a respective one of a plurality of second OR gate means;

establishing a clock signal;

inverting said clock signal;

supplying said inverted clock signal to the second input terminal of said plurality of said second OR gate means;

connecting the output terminal of a first one of said second OR gate means to the second input terminal of a first one of said first data register means to enable said first one of said first data register means if the output terminal of said first one of said second OR gate means has a logic value of 0;

utilizing the logic sequence of said control signals to provide said first digital signal to the first input of a plurality of first data register means; and utilizing the logic sequence of said control signals to automatically select one of said plurality of said first data register means to be enabled and to provide a first enabling signal having a predetermined logic value to the second input of the selected one of said plurality of said first data register means to enable the selected one of said plurality of said first data register means and initiate the digital-to-analog conversion of said first digital signal;

utilizing the logic sequence of said control signals to initiate transmission of said first digital signal via one of a plurality of optical isolator means; and converting the analog signal established in the digital-to-analog conversion of said first digital signal from a voltage to a current.

47. A method for converting a digital signal to an analog signal comprising the steps of:

establishing a first digital signal;

establishing control signals to route said first digital signal to a desired destination;

utilizing the logic sequence of said control signals to provide said first digital signal to the first input of a plurality of first data register means; and utilizing the logic sequence of said control signals to automatically select one of said plurality of said first data register means to be enabled and to provide a first enabling signal having a predetermined logic value to the second input of the selected one of said plurality of said first data register means to enable the selected one of said plurality of said first data register means and initiate the digital-to-analog conversion of said first digital signal;

utilizing the logic sequence of said control signals to initiate transmission of said first digital signal via one of a plurality of optical isolator means; and converting the analog signal established in the digital-to-analog conversion of said first digital signal from a voltage to a current.

* * * * *

UNITED STATES PATENT AND TRADEMARK OFFICE
CERTIFICATE OF CORRECTION

PATENT NO. : 4,233,500  
DATED : November 11, 1980  
INVENTOR(S) : Leroy D. Cordill Page 1 of 2

It is certified that error appears in the above-identified patent and that said Letters Patent is hereby corrected as shown below:

Column 44, line 3, beginning with "utilizing the logic" cancel all to and including, "a voltage to a current." and insert the following therefor:

-- connecting the output terminal of a second one of said second OR gate means to the second input terminal of a second one of said first data register means to enable said second one of said first data register means if the output terminal of said second one of said second OR gate means has a logic value of 0;

connecting the output terminal of a third one of said second OR gate means to the second input terminal of a third one of said first data register means to enable said third one of said first data register means if the output terminal of said third one of said second OR gate means has a logic value of 0, if said third one of said first data register means is utilized;

connecting the output terminal of a fourth one of said second OR gate means to the second input terminal of a fourth one of said first data register means to enable said fourth one of said first data register means if the output terminal of said fourth one of said second OR gate means has a logic value of 0,

UNITED STATES PATENT AND TRADEMARK OFFICE
CERTIFICATE OF CORRECTION

PATENT NO. : 4,233,500

DATED : November 11, 1980

INVENTOR(S) : Leroy D. Cordill

It is certified that error appears in the above-identified patent and that said Letters Patent is hereby corrected as shown below:

if said fourth one of said first data register means is utilized;

connecting the output terminal of a fifth one of said second OR gate means to the second input terminal of a fifth one of said first data register means to enable said fifth one of said first data register means if the output terminal of said fifth one of said second OR gate means has a logic value of 0, if said fifth one of said first data register means is utilized; and connecting the output terminal of a sixth one of said second OR gate means to the second input terminal of a sixth one of said first data register means to enable said sixth one of said first data register means if the output terminal of said sixth one of said second OR gate means has a logic value of 0, if said sixth one of said first data register means is utilized.

Signed and Sealed this

First Day of March 1983

[SEAL]

Attest:

GERALD J. MOSSINGHOFF

Attesting Officer    Commissioner of Patents and Trademarks